(12) United States Patent
Sung

(10) Patent No.: US 11,990,567 B2
(45) Date of Patent: May 21, 2024

(54) SEMICONDUCTOR DEVICE

(71) Applicant: SUZHOU LEKIN SEMICONDUCTOR CO., LTD., Taicang (CN)

(72) Inventor: Youn Joon Sung, Seoul (KR)

(73) Assignee: SUZHOU LEKIN SEMICONDUCTOR CO., LTD., Taicang (CN)

( * ) Notice: Subject to any disclaimer, the term of this patent is extended or adjusted under 35 U.S.C. 154(b) by 658 days.

(21) Appl. No.: 17/268,106

(22) PCT Filed: Aug. 6, 2019

(86) PCT No.: PCT/KR2019/009774
§ 371 (c)(1),
(2) Date: Feb. 12, 2021

(87) PCT Pub. No.: WO2020/040449
PCT Pub. Date: Feb. 27, 2020

(65) Prior Publication Data
US 2021/0305458 A1    Sep. 30, 2021

(30) Foreign Application Priority Data

Aug. 21, 2018  (KR) ................... 10-2018-0097599

(51) Int. Cl.
*H01L 33/00*    (2010.01)
*H01L 33/20*    (2010.01)
(Continued)

(52) U.S. Cl.
CPC .......... *H01L 33/382* (2013.01); *H01L 33/005* (2013.01); *H01L 33/62* (2013.01);
(Continued)

(58) Field of Classification Search
CPC ....... H01L 33/005; H01L 33/20; H01L 33/38; H01L 33/382; H01L 33/62; H01L 2933/0016; H01L 2933/0066
See application file for complete search history.

(56) References Cited

U.S. PATENT DOCUMENTS 10,103,305 B2    10/2018  Yoon et al.
10,290,769 B2    5/2019   Lee et al.
(Continued)

FOREIGN PATENT DOCUMENTS

JP    2013-135185 A    7/2013
JP    2017-5191 A      1/2017
(Continued)

*Primary Examiner* — Omar F Mojaddedi
(74) *Attorney, Agent, or Firm* — Birch, Stewart, Kolasch & Birch, LLP

(57) ABSTRACT

Disclosed in an embodiment is a semiconductor device comprising: a substrate; a light emitting structure including a first conductive semiconductor layer and a second conductive semiconductor layer, which are arranged on the substrate, an active layer arranged between the first conductive semiconductor layer and the second conductive semiconductor layer, a concave part that is concave on the second conductive semiconductor layer toward the first conductive semiconductor layer, and a recess; a first electrode arranged on the concave part and electrically connected to the first conductive semiconductor layer; a second electrode arranged on the light emitting structure and electrically connected to the second conductive semiconductor layer; a first pad arranged on the first electrode; and a second pad arranged on the second electrode, wherein the recess separates the second conductive semiconductor layer and the active layer into an active region and an inactive region, and the first pad vertically overlaps the concave part, the second conductive semiconductor layer on the inactive region, and the recess.

17 Claims, 9 Drawing Sheets

(51) Int. Cl.
*H01L 33/38* (2010.01)
*H01L 33/62* (2010.01)

(52) U.S. Cl.
CPC ................. *H01L 2933/0016* (2013.01); *H01L 2933/0066* (2013.01)

(56) References Cited

U.S. PATENT DOCUMENTS

| | | | |
|---|---|---|---|
| 2013/0161674 A1 | 6/2013 | Itonaga | |
| 2016/0365481 A1* | 12/2016 | Katsuno | ................. H01L 33/38 |
| 2017/0338390 A1* | 11/2017 | Yoon | ........................ H01L 33/62 |
| 2019/0273181 A1* | 9/2019 | Lee | ........................ H01L 33/38 |

FOREIGN PATENT DOCUMENTS

| | | |
|---|---|---|
| KR | 10-2016-0053138 A | 5/2016 |
| KR | 10-2018-0029606 A | 3/2018 |
| KR | 10-2018-0084652 A | 7/2018 |
| KR | 10-2018-0087679 A | 8/2018 |

\* cited by examiner

[FIG.1]
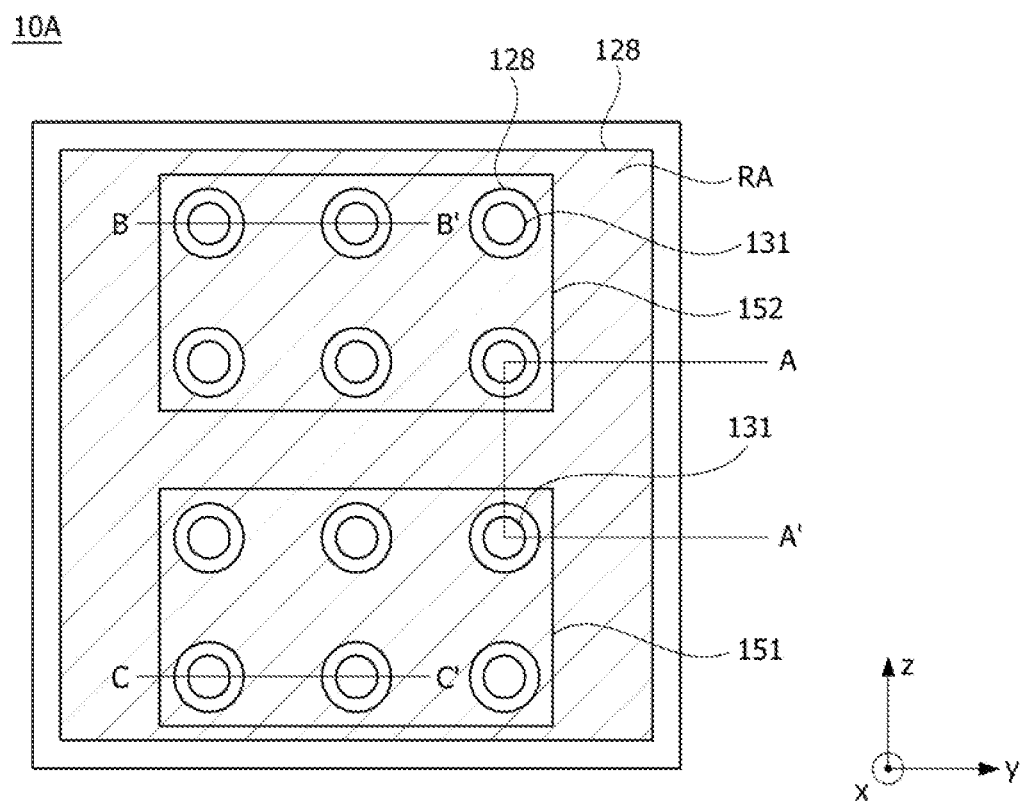

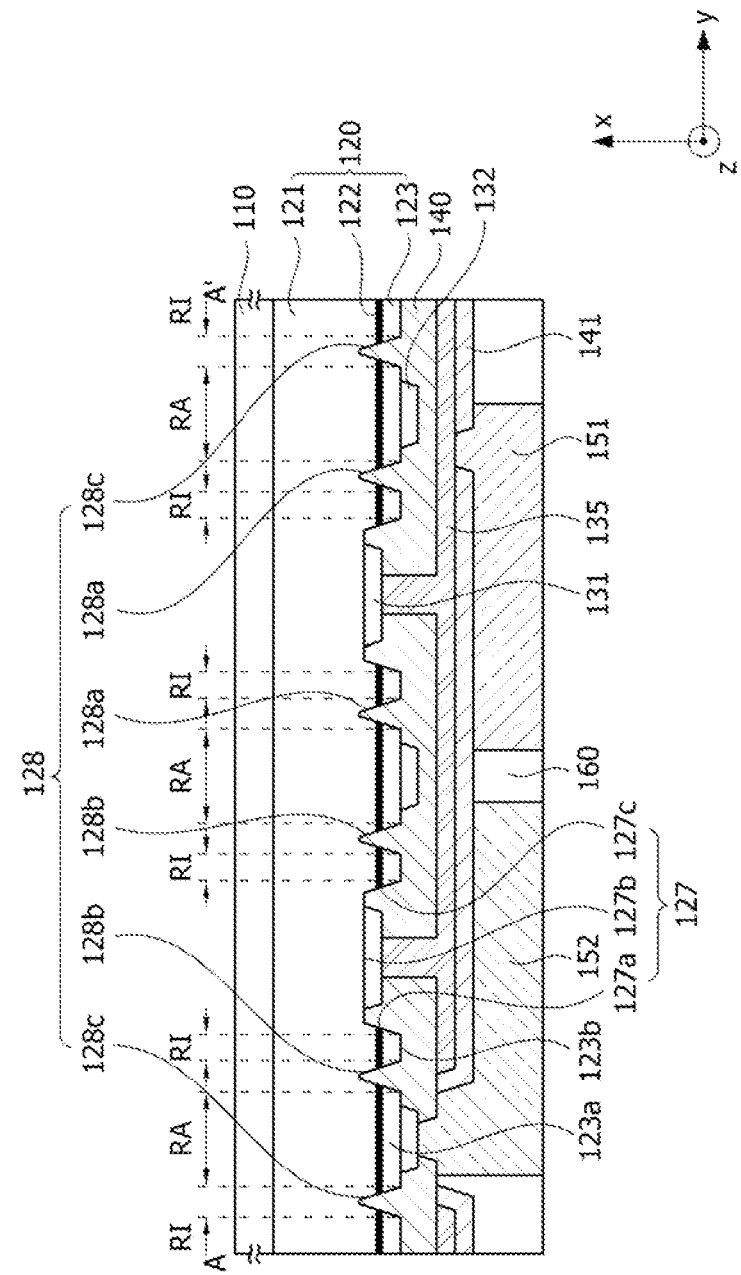
[FIG.2]

【FIG.3】
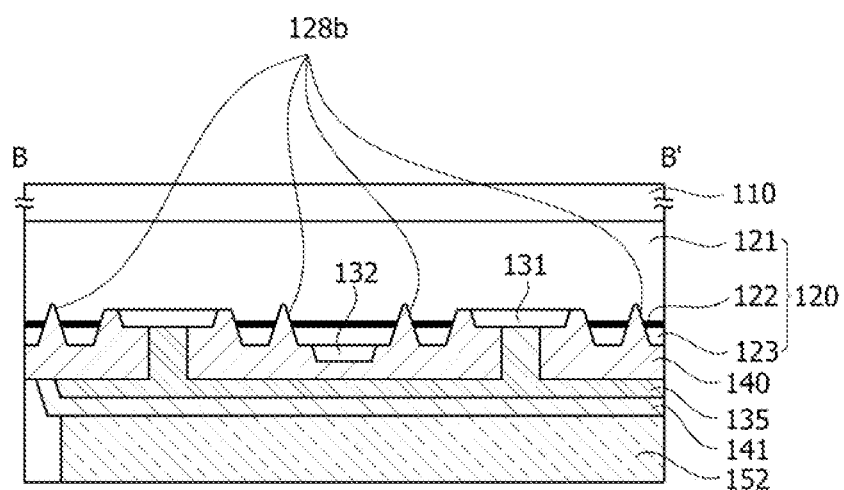
【FIG.4】
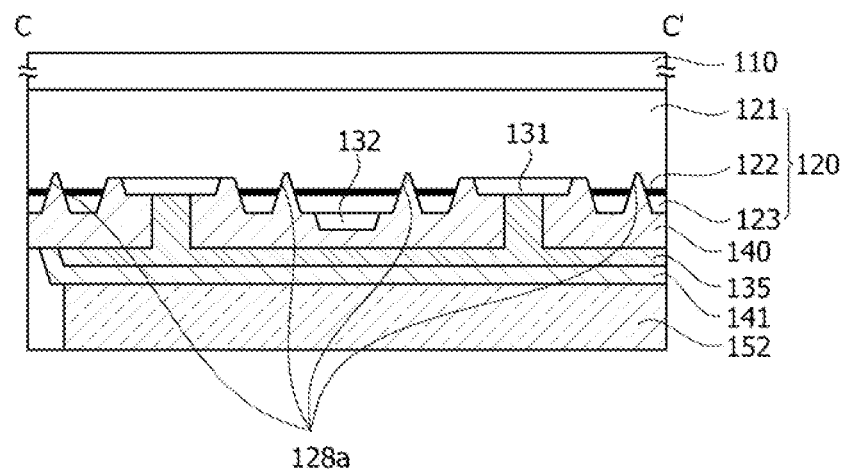

[FIG.5]
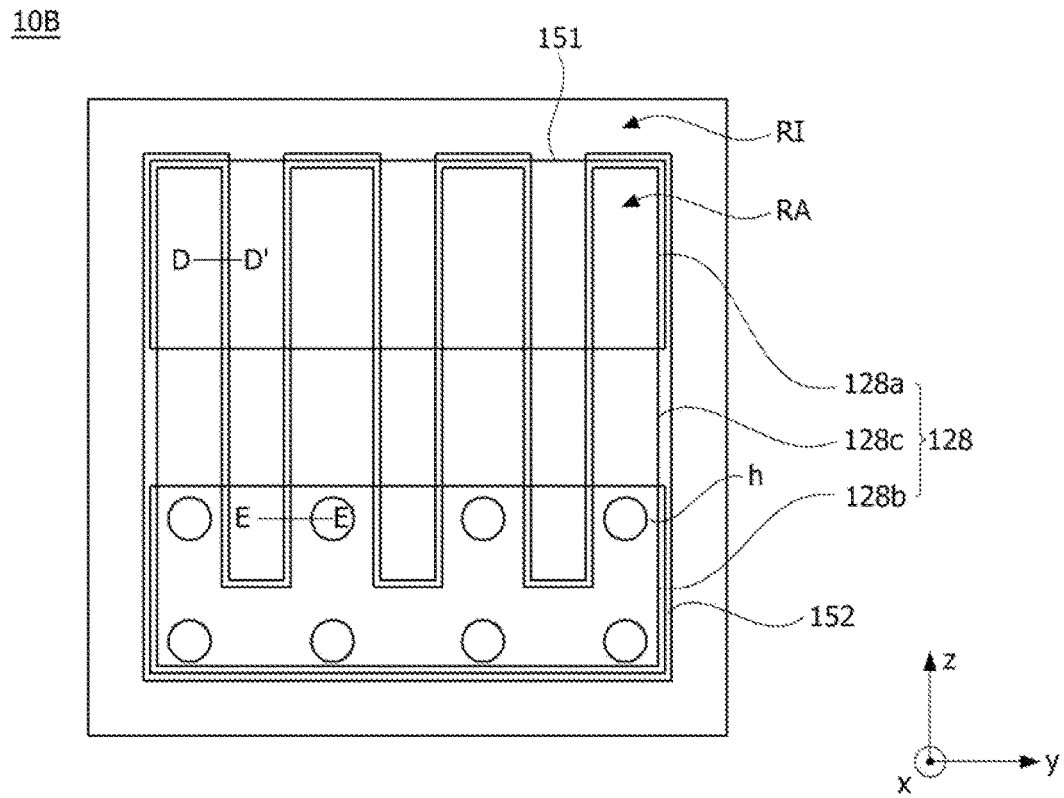
[FIG.6]
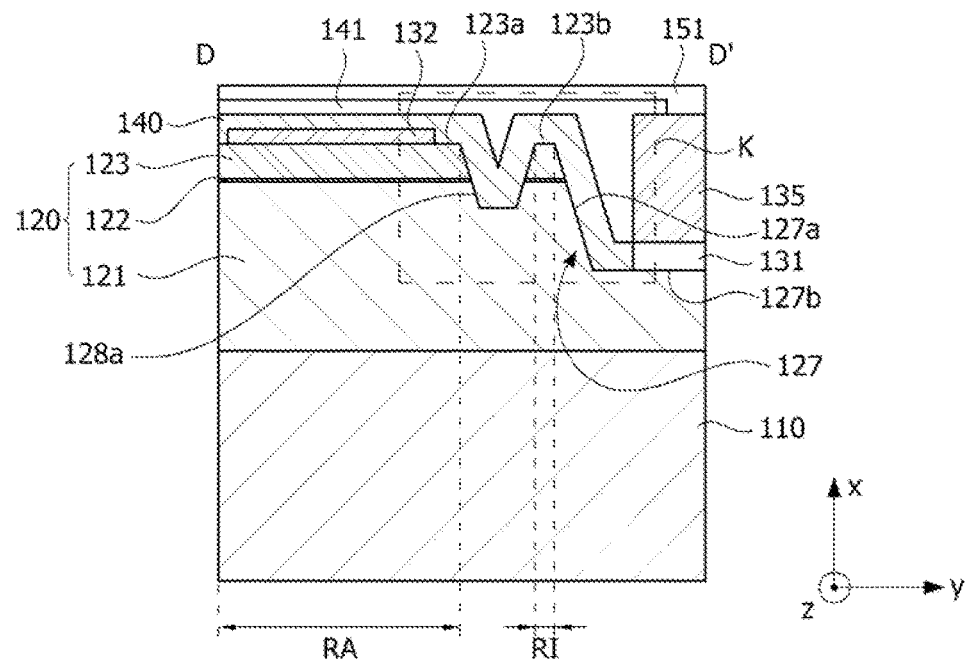

[FIG.7]
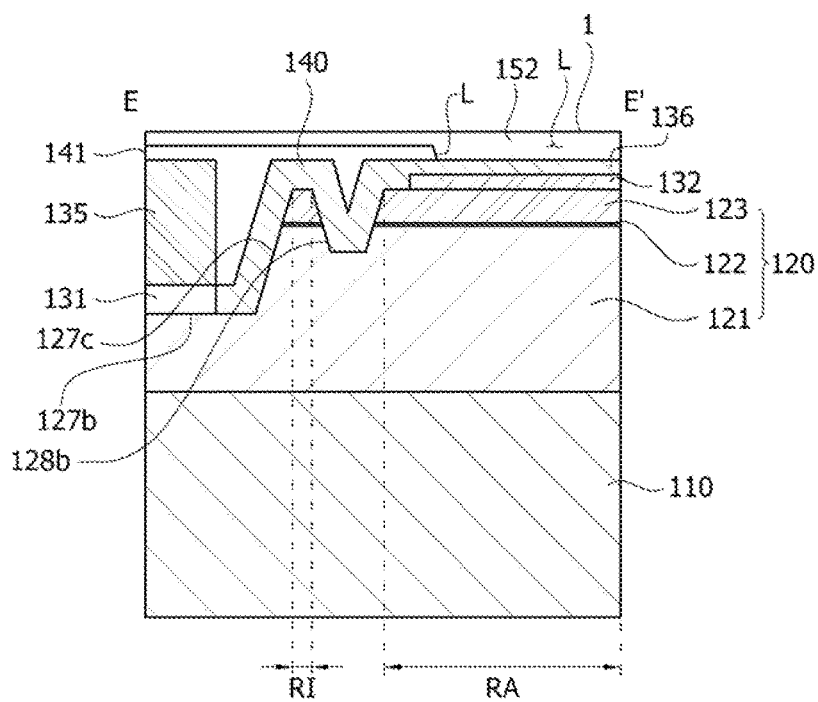
[FIG.8]
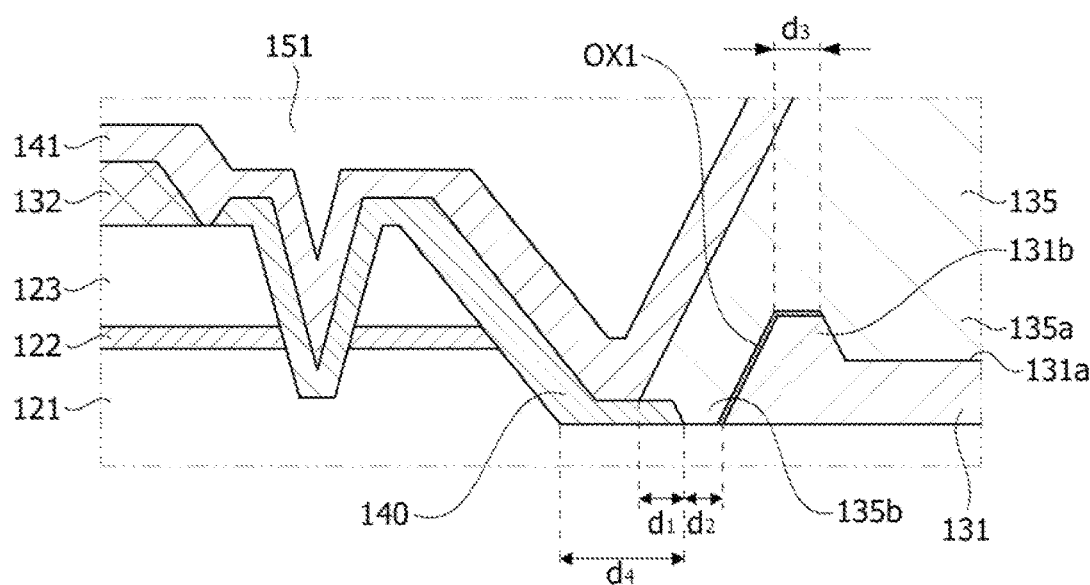

[FIG.9]
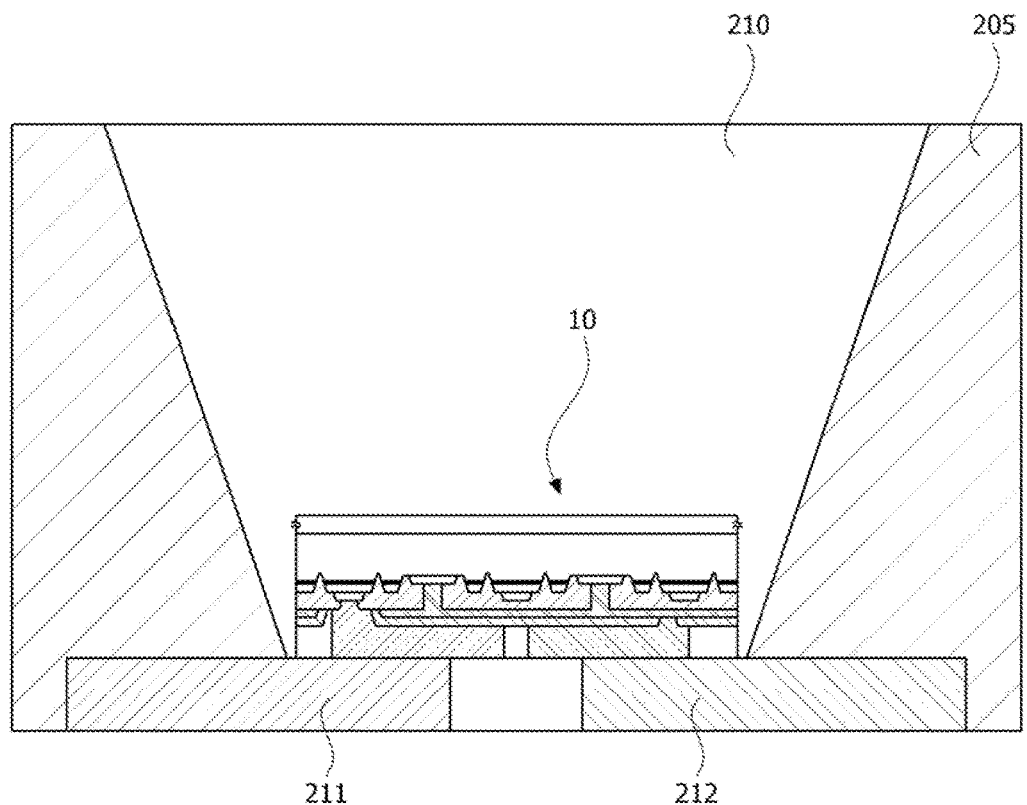
[FIG.10a]
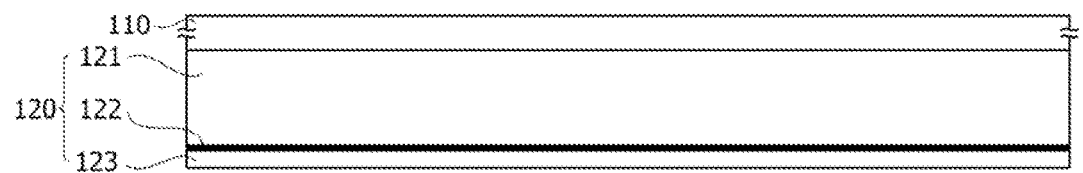

[FIG.10b]
[FIG.10c]
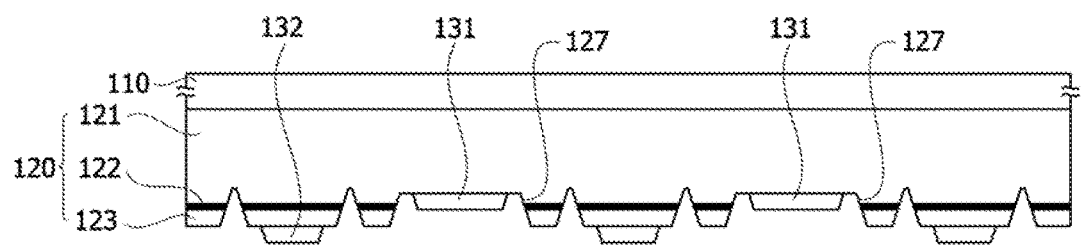
[FIG.10d]
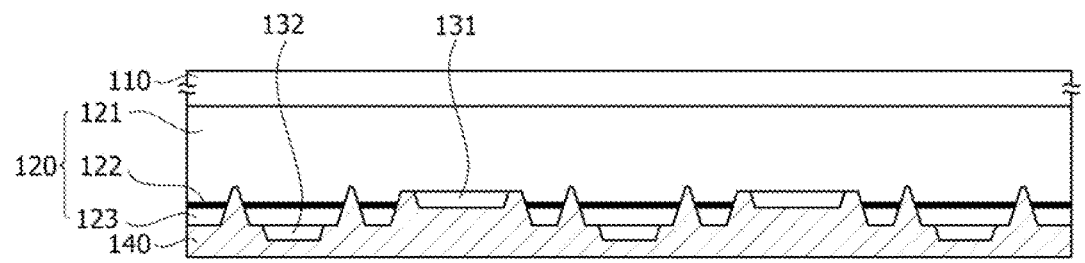
[FIG.10e]
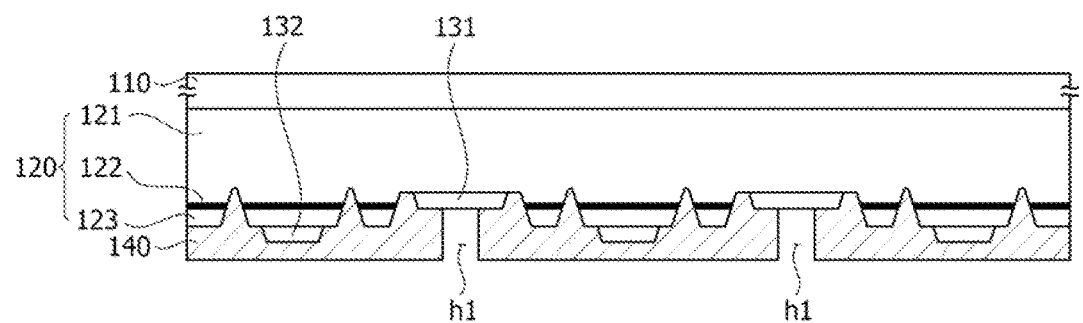

[FIG.10f]
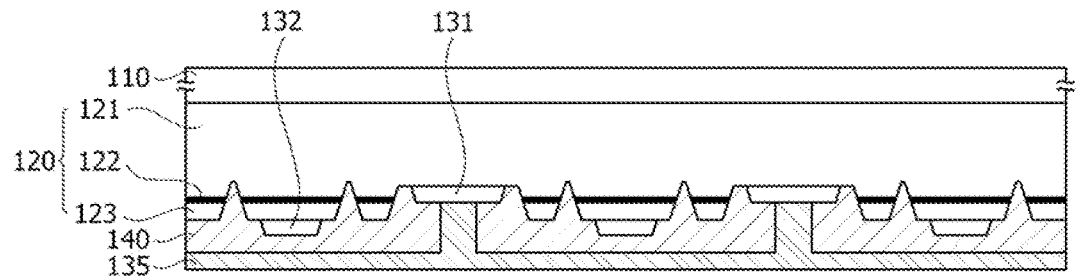
[FIG.10g]
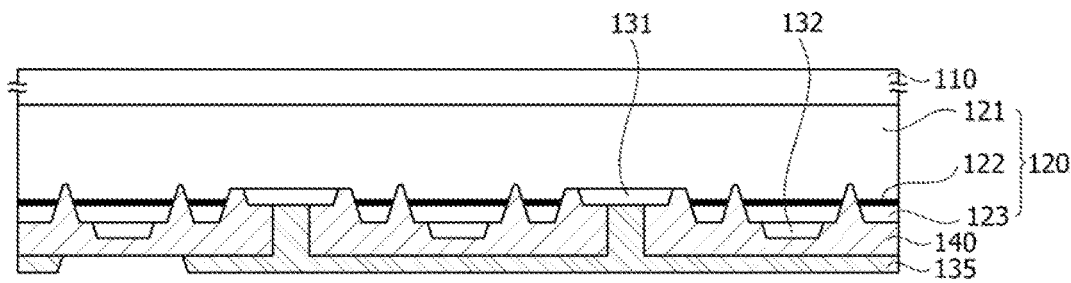
[FIG.10h]
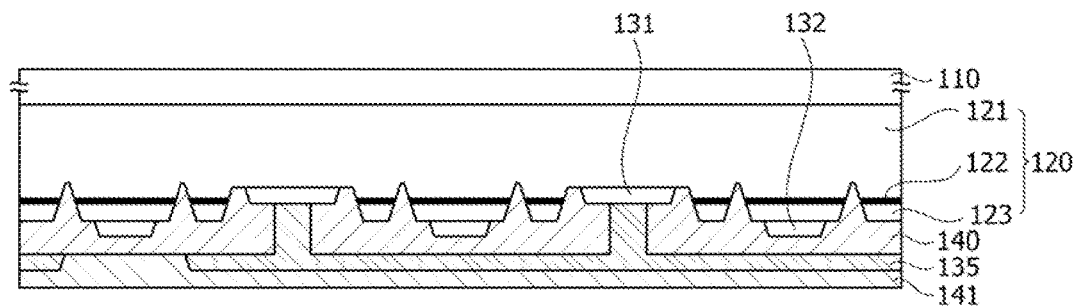

[FIG.10i]
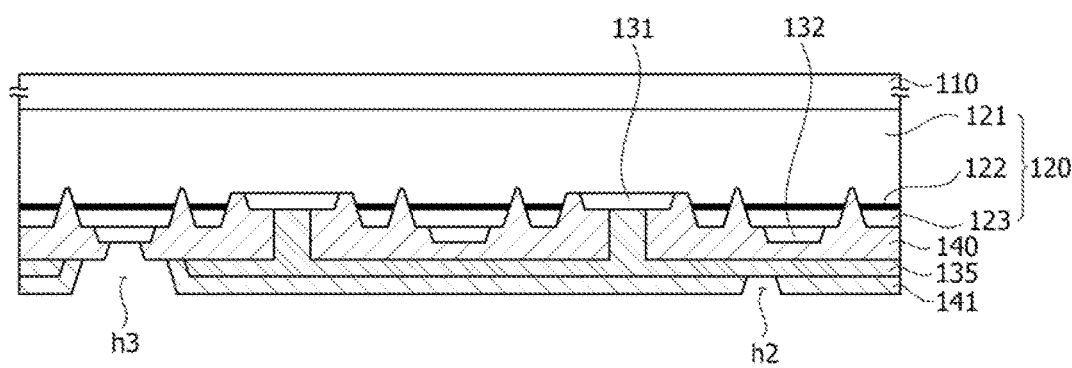
[FIG.10j]
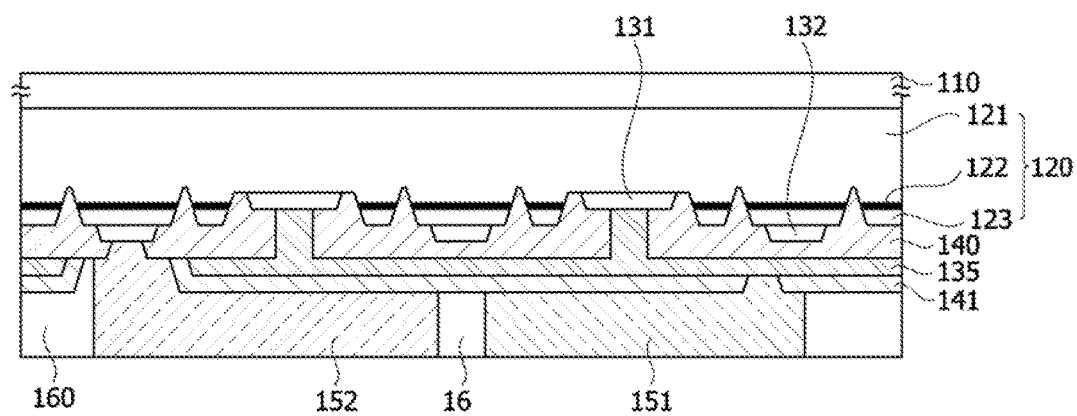

SEMICONDUCTOR DEVICE

CROSS REFERENCE TO RELATED APPLICATIONS

This application is the National Phase of PCT International Application No. PCT/KR2019/009774, filed on Aug. 6, 2019, which claims priority under 35 U.S.C. 119(a) to Patent Application No. 10-2018-0097599, filed in the Republic of Korea on Aug. 21, 2018, all of which are hereby expressly incorporated by reference into the present application.

TECHNICAL FIELD

An embodiment relates to a semiconductor device.

BACKGROUND ART

A semiconductor device including a compound such as GaN, AlGaN, or the like has many advantages such as having wide and easily adjustable band gap energy and thus can be variously used as a light emitting device, a light receiving device, various diodes, and the like.

Specifically, a light emitting device such as a light emitting diode or laser diode using group III-V or II-VI compound semiconductor materials can implement various colors such as red, green, blue, ultraviolet rays, and the like through the development of thin film growth technology and device materials, can implement white light with high efficiency by using fluorescent materials or combining colors, and has advantages of low power consumption, semi-permanent lifespan, quick response time, safety, environmental friendliness, and the like in comparison with conventional light sources such as a fluorescent lamp, an incandescent lamp, and the like.

In addition, when a light receiving device such as a photodetector or solar cell is also manufactured using group III-V or II-VI compound semiconductor materials, due to the development of device materials, light in various wavelength ranges from a gamma ray range to a radio wavelength range can be used by absorbing light in various wavelength ranges and generating a photocurrent. In addition, the light receiving device has advantages of quick response time, safety, environmental friendliness, and easy adjustment of the device materials and thus can be easily used for power control, ultra-high frequency circuits, or communication modules.

Accordingly, application of the semiconductor device is being expanded to a transmission module of an optical communication means, a light emitting diode backlight replacing a cold cathode fluorescence lamp (CCFL) that constitutes a backlight of a liquid crystal display (LCD) device, a white light emitting diode lighting device capable of replacing a fluorescent or an incandescent bulb, car headlights, traffic lights, a sensor which senses gas or fire, and the like. Further, the application of the semiconductor device can be expanded to a high frequency application circuit, other power control devices, and a communication module.

Specifically, a light emitting device which emits light in an ultraviolet wavelength range can be used for curing, medical, and sterilizing purposes by performing a curing or sterilizing action.

Although research on an ultraviolet light emitting device is active recently, the ultraviolet light emitting device has a problem in that optical output is lowered due to oxidization by peeling and moisture.

DISCLOSURE

Technical Problem

An embodiment is directed to providing a flip chip-type red semiconductor device.

Further, an embodiment is directed to providing a semiconductor device of which reliability is enhanced due to improved heat dissipation.

In addition, an embodiment is directed to providing a semiconductor device having an excellent current dispersion effect.

Problems to be solved by the present invention are not limited to the above-described problems, and purposes and effects understood from the solutions and embodiments which will be described below are also included.

Technical Solution

One aspect of the present invention provides a semiconductor device including: a substrate; a light emitting structure including a first conductive semiconductor layer, a second conductive semiconductor layer, and an active layer arranged between the first conductive semiconductor layer and the second conductive semiconductor layer, which are arranged on the substrate, a concave part that is concave on the second conductive semiconductor layer toward the first conductive semiconductor layer, and a recess; a first electrode arranged on the concave part and electrically connected to the first conductive semiconductor layer; a second electrode arranged on the light emitting structure and electrically connected to the second conductive semiconductor layer; a first pad arranged on the first electrode; and a second pad arranged on the second electrode, wherein the recess separates the second conductive semiconductor layer and the active layer into an active region and an inactive region, and the first pad overlaps the concave part, the second conductive semiconductor layer in the inactive region, and the recess in a vertical direction.

The second conductive semiconductor layer in the inactive region and the active layer may be arranged between the concave part and the recess.

The second pad may overlap the concave part, the second conductive semiconductor layer in the inactive region, and the recess in the vertical direction.

The recess may be arranged to extend adjacent to at least one of an edge of the light emitting structure and an edge of the recess.

The recess may overlap at least one of at least a portion of the first pad and at least a portion of the second pad in the vertical direction.

The recess may include a first recess portion overlapping the first pad in the vertical direction, a second recess portion overlapping the second pad in the vertical direction, and a third recess portion other than the first recess portion and the second recess portion.

The first recess portion and the second recess portion may be arranged to be spaced apart from each other, the third recess portion may be arranged between the first recess portion and the second recess portion, and the third recess portion may be connected to the first recess portion and the second recess portion.

The third recess portion may surround the first recess portion and the second recess portion.

The first recess portion, the second recess portion, and the third recess portion may be arranged to be spaced apart from each other, the first recess portion and the second recess portion may be arranged to surround the concave part, and the first recess portion and the second recess portion may be arranged at an inner side of the third recess portion.

The semiconductor device may further include a first bump arranged on the first electrode, and a plurality of second bumps arranged on the second electrode to be spaced apart from each other.

The semiconductor device may further include a first insulating layer partially arranged on the light emitting structure.

The semiconductor device may further include a second insulating layer configured to cover a part of the first insulating layer, wherein the first pad and the second pad are arranged on the second insulating layer.

Advantageous Effects

According to an embodiment, a semiconductor device can be implemented in a flip chip type.

Further, a semiconductor device of which reliability is enhanced due to improved heat dissipation can be manufactured.

In addition, a semiconductor device having an excellent current dispersion effect can be manufactured.

Various useful advantages and effects of the present invention are not limited to the above and can be relatively easily understood in a process of describing exemplary embodiments of the present invention.

DESCRIPTION OF DRAWINGS

FIG. 1 is a plan view of a semiconductor device according to one embodiment.

FIG. 2 is a cross-sectional view taken along line AA' in FIG. 1.

FIG. 3 is a cross-sectional view taken along line BB' in FIG. 1.

FIG. 4 is a cross-sectional view taken along line CC' in FIG. 1.

FIG. 5 is a plan view of a semiconductor device according to another embodiment.

FIG. 6 is a cross-sectional view taken along line DD' in FIG. 5.

FIG. 7 is a cross-sectional view taken along line EE' in FIG. 5.

FIG. 8 is an enlarged view of portion K in FIG. 6.

FIG. 9 is a conceptual diagram of a semiconductor device package according to the embodiment.

FIGS. 10A to 10J are views illustrating a method of manufacturing the semiconductor device according to one embodiment.

MODES OF THE INVENTION

Hereinafter, preferable embodiments of the present invention will be described in detail with reference to the accompanying drawings.

However, the technical spirit of the present invention is not limited to some embodiments which will be described and may be embodied in various forms, and one or more elements in the embodiments may be selectively combined and replaced to be used within the scope of the technical spirit of the present invention.

Further, terms used in the embodiments of the present invention (including technical and scientific terms), may be interpreted with meanings that are generally understood by those skilled in the art unless particularly defined and described, and terms which are generally used, such as terms defined in a dictionary, may be understood in consideration of their contextual meanings in the related art.

In addition, terms used in the description are provided not to limit the present invention but to describe the embodiments.

In the specification, the singular form may also include the plural form, unless the context clearly indicates otherwise, and may include one or more of all possible combinations of A, B, and C when disclosed as at least one (or one or more) of "A, B, and C".

In addition, terms such as first, second, A, B, (a), (b), and the like may be used to describe elements of the embodiments of the present invention.

The terms are only provided to distinguish the elements from other elements, and the essence, sequence, order, or the like of the elements are not limited by the terms.

Further, when particular elements are disclosed as being "connected," "coupled," or "linked" to other elements, the elements may include not only a case of being directly connected, coupled, or linked to other elements but also a case of being connected, coupled, or linked to other elements by elements between the elements and other elements.

In addition, when one element is disclosed as being formed "on or under" another element, the term "on or under" includes both a case in which the two elements are in direct contact with each other and a case in which at least another element is disposed between the two elements (indirectly). Further, when the term "on or under" is expressed, a meaning of not only an upward direction but also a downward direction may be included with respect to one element.

A light emitting structure according to an embodiment of the present invention may emit light in an ultraviolet wavelength band. For example, the light emitting structure may emit light in a near ultraviolet wavelength band (ultraviolet (UV)-A), may emit light in a far ultraviolet wavelength band (UV-B), and may emit light in a deep ultraviolet wavelength band (UV-C). The wavelength range may be determined by a composition ratio of Al in a light emitting structure 120. Further, the light emitting structure may output light of various wavelengths with different light intensities, and a peak wavelength of light having the strongest intensity compared to the intensity of other wavelengths among the wavelengths of emitted light may be a near ultraviolet ray, a far ultraviolet ray, or a deep ultraviolet ray.

For example, the light in the near ultraviolet wavelength band (UV-A) may have a wavelength ranging from 320 nm to 420 nm, the light in the far ultraviolet wavelength band (UV-B) may have a wavelength ranging from 280 nm to 320 nm, and the light in the deep ultraviolet wavelength band (UV-C) may have a wavelength ranging from 100 nm to 280 nm.

FIG. 1 is a plan view of a semiconductor device according to one embodiment, FIG. 2 is a cross-sectional view taken along line AA' in FIG. 1, FIG. 3 is a cross-sectional view taken along line BB' in FIG. 1, and FIG. 4 is a cross-sectional view taken along line CC' in FIG. 1.

First, referring to FIGS. 1 and 2, a semiconductor device 10A according to one embodiment includes a substrate 110, a light emitting structure 120 including a first conductive semiconductor layer 121, a second conductive semiconductor layer 123, and an active layer 122 and arranged on the substrate 110, a first insulating layer 140 partially arranged on the light emitting structure 120, a first electrode 131 electrically connected to the first conductive semiconductor layer 121, a second electrode 132 electrically connected to the second conductive semiconductor layer 123, a first pad 151 arranged on the first electrode 131, a second pad 152 arranged on the second electrode 132, and a second insulating layer 141 arranged on the first insulating layer 140.

The substrate 110 may be arranged at one side of the semiconductor device 10A. For example, the substrate 110 may be arranged under the semiconductor device 10A. The substrate 110 may be transparent and may be an insulating substrate 110. The substrate 110 may be formed of at least one of Al, Si, O, Zn, Mg, Ga, P, and F and, specifically, may be formed of a material selected from sapphire ($Al_2O_3$), SiC, GaN, ZnO, Si, GaP, InP, and Ge, but the substrate 110 is not particularly limited as long as it is a material which transmits light generated from the light emitting structure 120.

An uneven portion may be formed under the substrate 110 and may be formed in a textured structure to improve light extraction efficiency. For example, the semiconductor device 10A has a flip type, light may be emitted upward through the substrate 110, and light emitted to the outside of the semiconductor device 10A from the inside may be increased by the uneven portion of the substrate 110. For example, the substrate 110 may be formed of a material having a refractive index between 1 and 3.4 to minimize total reflection at an interface which is in contact with the outside. However, the substrate 110 is not limited to this structure and may have various structures.

The light emitting structure 120 may include the first conductive semiconductor layer 121, the active layer 122, and the second conductive semiconductor layer 123. In this case, the first conductive semiconductor layer 121, the active layer 122, and the second conductive semiconductor layer 123 may be arranged in a first direction (an X direction). Hereinafter, the first direction (the X direction), which is a thickness direction of each layer, is defined as a vertical direction, and a second direction (a Y direction) perpendicular to the first direction (the X direction) is defined as a horizontal direction. Further, a third direction (a Z direction) is a direction perpendicular to both the first direction (the X direction) and the second direction (the Y direction).

The first conductive semiconductor layer 121 may be implemented with a group III-V or II-VI compound semiconductor and may be doped with a first dopant. The first conductive semiconductor layer 121 may be selected from semiconductor materials having a composition formula of $In_{x1}Al_{y1}Ga_{1-x1-y1}N$ ($0 \leq x1 \leq 1$, $0 \leq y1 \leq 1$, and $0 \leq x1+y1 \leq 1$), for example, GaN, AlGaN, InGaN, InAlGaN, and the like. Further, the first dopant may be an n-type dopant such as Si, Ge, Sn, Se, and Te. When the first dopant is an n-type dopant, the first conductive semiconductor layer 121 doped with the first dopant may be an n-type semiconductor layer.

The active layer 122 may be arranged between the first conductive semiconductor layer 121 and the second conductive semiconductor layer 123. The active layer 122 may be a layer in which electrons (or holes) injected through the first conductive semiconductor layer 121 and holes (or electrons) injected through the second conductive semiconductor layer 123 are recombined. As the electrons and the holes recombine in the active layer 122, the electrons transition to a low energy level, and light having a wavelength corresponding to the band gap energy of a well layer to be described below and included in the active layer 122 may be generated. A wavelength of light having the relatively largest intensity among wavelengths of light emitted by the semiconductor device may be ultraviolet rays, and the ultraviolet rays may be near ultraviolet rays, far ultraviolet rays, and deep ultraviolet rays which are described above.

The active layer 122 may have one structure among a single well structure, a multiple well structure, a single quantum well structure, a multi quantum well (MQW) structure, a quantum dot structure, and a quantum wire structure, and the structure of the active layer 122 is not limited thereto.

The second conductive semiconductor layer 123 may be formed on the active layer 122, may be implemented with a group III-V or II-VI compound semiconductor, and may be doped with a second dopant. The second conductive semiconductor layer 123 may be formed of a semiconductor material having a composition formula of $In_{x5}Al_{y2}Ga_{1-x5-y2}N$ ($0 \leq x5 \leq 1$, $0 \leq y2 \leq 1$, $0 \leq x5+y2 \leq 1$), or a material selected from AlInN, AlGaAs, GaP, GaAs, GaAsP, and AlGaInP. When the second dopant is a p-type dopant such as Mg, Zn, Ca, Sr, Ba, or the like, the second conductive semiconductor layer 123 doped with the second dopant may be a p-type semiconductor layer.

In addition, an electron blocking layer (not shown) may be arranged between the active layer 122 and the second conductive semiconductor layer 123. Since electrons supplied from the first conductive semiconductor layer 121 to the active layer 122 do not recombine in the active layer 122 to emit light and are blocked from escaping to the second conductive semiconductor layer 123, the electron blocking layer (not shown) may increase the probability that electrons and holes recombine in the active layer 122. An energy band gap of the electron blocking layer (not shown) may be larger than an energy band gap of the active layer 122 and/or the second conductive semiconductor layer 123.

The electron blocking layer (not shown) may be selected from semiconductor materials having a composition formula of $In_{x1}Al_{y1}Ga_{1-x1-y1}N$ ($0 \leq x1 \leq 1$, $0 \leq y1 \leq 1$, and $0 \leq x1+y1 \leq 1$), for example, AlGaN, InGaN, InAlGaN, and the like, but is not limited thereto. Further, in the electron blocking layer (not shown), first layers (not shown) having a high aluminum composition and second layers (not shown) having a low aluminum composition may be alternately arranged.

Further, all of the first conductive semiconductor layer 121, the active layer 122, and the second conductive semiconductor layer 123 may include aluminum. Accordingly, the first conductive semiconductor layer 121, the active layer 122, and the second conductive semiconductor layer 123 may be AlGaN. However, the first conductive semiconductor layer 121, the active layer 122, and the second conductive semiconductor layer 123 are not necessarily limited thereto.

Further, when all of the first conductive semiconductor layer 121, the active layer 122, and the second conductive semiconductor layer 123 include aluminum, the electron blocking layer (not shown) may have an aluminum composition of 50% to 90%. When the aluminum composition of the electron blocking layer (not shown) is less than 50%, a height of an energy barrier for blocking the electrons may be insufficient, and the light emitted from the active layer 122 may be absorbed by the electron blocking layer (not shown), and when the aluminum composition exceeds 90%, electrical characteristics of the semiconductor device may be degraded.

Further, the light emitting structure 120 may include a concave part 127 and a recess 128.

First, the concave part 127 may be arranged on the second conductive semiconductor layer 123 to be concave toward the first conductive semiconductor layer 121. More specifically, the concave part 127 is arranged to penetrate the second conductive semiconductor layer 123 and the active layer 126 and penetrate to a partial region of the first conductive semiconductor layer 121, and thus the first conductive semiconductor layer 121 may be exposed.

The concave part 127 may be arranged in the light emitting structure 120 and may be arranged to be further inward with relation to the light emitting structure 120 than the recess 128. For example, the recess 128 may be surrounded by the concave part 127. Specifically, a first recess portion 128a and a second recess portion 128b which will be described later may be arranged to surround the concave part 127.

Further, the concave part 127 may be arranged at an inner side of an inactive region RI which will be described later. That is, the concave part 127 may overlap the inactive region RI in the second direction.

Further, the concave part 127 may have a circular shape but is not limited to this shape. In addition, the recess 128 is also arranged to extend adjacent to an edge of the concave part 127 and thus may have various shapes like the concave part 127.

The concave part 127 may include a second surface 127b located at a bottom portion, a first surface 127a arranged at one side of the second surface 127b, and a third surface 127c arranged at the other side of the second surface 127b. The first surface 127a may extend to the first conductive semiconductor layer 121 exposed along a second upper surface 123b of the second conductive semiconductor layer 123 which will be described later. Accordingly, the first surface 127a may include side surfaces of the first conductive semiconductor layer 121, the active layer 122, and the second conductive semiconductor layer 123. Further, the first surface 127a may be arranged to be inclined with respect to the second upper surface 123b at a predetermined angle.

In addition, the second surface 127b may be a bottom surface extending from the first surface 127a and to which the first conductive semiconductor layer 121 is exposed. The first electrode 131 which will be described later may be arranged on the second surface 127b.

Further, the third surface 127c may be a portion extending from the second surface 127b to the second upper surface 123b. The third surface 127c may be a surface opposite to the first surface 127a with respect to the second surface 127b. For example, the first surface 127a and the third surface 127c may be arranged to surround the second surface 127b, and the first to third surfaces 127a to 127c may have a cup structure.

Further, the recess 128 may be arranged to penetrate second conductive semiconductor layer 123 and the active layer 122 and penetrate to a partial region of the first conductive semiconductor layer 121. Accordingly, the partial region of the first conductive semiconductor layer 121 may be exposed by the recess 128.

Further, the recess 128 may extend adjacent to an edge of the light emitting structure 120 and an edge of the concave part 127. Specifically, the recess 128 may extend adjacent to an edge of the active layer 122 or the second conductive semiconductor layer 123. Further, the recesses 128 may be continuously arranged. For example, when the recesses 128 are continuously arranged, the recesses 128 on a plane (a ZY plane) may have a closed-loop shape in the light emitting structure 120. Hereinafter, the recesses 128 will be described based on a case of the closed-loop shape.

Accordingly, the recesses 128 may separate the second conductive semiconductor layer 123 and the active layer 122 into an active region RA and the inactive region RI (In the drawing, the active region and the inactive region are shown based on the second conductive semiconductor layer, and the active region and the inactive region are set within ranges described in the specification). Here, the active regions RA may be located at inner sides of the recesses 128 at the second conductive semiconductor layer 123 and the active layer 122. More specifically, the active region RA may be located between the recess 128 adjacent to the edge of the light emitting structure 120 and the recess 128 adjacent to the edge of the concave part 127.

Further, the inactive region RI may be located in a region other than the recess 128 in the second conductive semiconductor layer 123 and the active layer 122. That is, the inactive region RI may be located at an outer side of the recess 128 adjacent to the edge of the light emitting structure 120 and an inner side of the recess 128 adjacent to the edge of the concave part 127. Further, the inactive region RI may be arranged between the concave part 127 and the recess 128.

In addition, the upper surface of the second conductive semiconductor layer 123 may be partitioned into a first upper surface 123a and the second upper surface 123b by the recess 128. The first upper surface 123a and the second upper surface 123b may be spaced apart and electrically separated by the recess 128.

The active layer 122 in the active region RA and the active layer 122 in the inactive region RI may be arranged to be spaced apart from each other. The active layer 122 in the active region RA may be arranged to overlap the second electrode 132 in the first direction. Further, in the active region RA, the active layer 122 may be a light emitting region in which electron and hole combination occurs. On the other hand, the active layer 122 in the inactive region RI may be arranged to be spaced apart from the active layer 122 in the active region RA and overlap the first electrode 131 in the first direction. Further, the active layer 122 in the inactive region RI may be a non-light emitting region in which the electron and hole combination does not occur.

By this configuration, even when peeling, cracking, and the like occur in the second insulating layer 141 surrounding the side surfaces and the upper surface of the light emitting structure 120 due to heat generated by light emission of the semiconductor device, external high temperature and high humidity, a difference in coefficient of thermal expansion between the light emitting structures 120, and the like, oxidization of the active layer 122 in the active region RA by external moisture, contaminants, or the like which penetrate into the light emitting structure 120 from the outside may be prevented.

Specifically, in the semiconductor device according to one embodiment, the recesses 128 may block connection between the active layer 122 in the active region RA and the active layer 122 in the inactive region RI. Accordingly, when the active layer 122 in the inactive region RI adjacent to a sidewall of the light emitting structure 120 is exposed to the outside due to the aforementioned peeling, the active layer 122 in the inactive region RI may be oxidized due to exposure.

However, since the active layers 122 in the active region RA and the inactive region RI are arranged to be spaced apart from each other by the recesses 128, even when the active layer 122 in the inactive region RI is oxidized, the active layer 122 in the active region RA may be protected from the oxidation. That is, the recess 128 may protect the oxidation of the active layer 122 in the active region from external moisture.

Specifically, when the semiconductor device generates ultraviolet light, since the energy band gap and Al concentration of the active layer 122 increase compared to a case in which visible light is generated, it may be more susceptible to oxidation. Accordingly, the semiconductor device described in the specification may significantly improve reliability when generating the ultraviolet light.

Further, when the light emitting structure 120 generates the ultraviolet light, since the light emitting structure 120 has high band gap energy, a current dispersion characteristic of the light emitting structure 120 may be degraded and an effective light emitting region may be reduced.

For example, when the light emitting structure 120 is composed of a GaN-based compound semiconductor, in order to emit the ultraviolet light, the light emitting structure may be composed of $Al_xGa_{(1-x)}N$ ($0 \leq x \leq 1$) including a large amount of Al. Here, as an x value which refers to an Al content increases, a resistance of the light emitting structure 120 may also increase, and current dispersion and current injection characteristics of the light emitting structure 120 may be degraded.

Accordingly, current spreading in the light emitting structure 120 may be mostly performed in the active region RA. Accordingly, even when the semiconductor device 10A described in the specification has the recess 128, it is possible to maintain optical output. In addition, as described above, the region in which the recess 128 is oxidized due to moisture or the like is limited to an outer region of the recess 128 (for example, the active region RA) to protect the active layer 122 located on an effective light-emitting region (for example, the inactive region RI) from oxidization so that the optical output may be maintained. Here, the effective light-emitting region refers to a region having optical output of a predetermined ratio (for example, 40%) or more of maximum optical output.

Further, the recess 128 may include the first recess portion 128a overlapping the first pad 151, the second recess portion 128b overlapping the second pad 152, and the other concave part 128c. Specifically, the first recess portion 128a and the second recess portion 128b extend adjacent to the edge of the concave part 127 which will be described later to protect a region into which currents are injected through the second electrode 132 in the concave part 127 from oxidation. Each recess portion of this recess will be described later.

Further, the concave part 127 and the recess 128 may each have a circular shape, and in this case, a diameter of the recess 128 may be larger than a diameter of the concave part 127.

The first electrode 131 may be arranged in the concave part 127 and on the exposed first conductive semiconductor layer 121 to be electrically connected to the first conductive semiconductor layer 121.

Further, the first electrode 131 may be arranged on a low concentration layer of the active layer 122 to secure a relatively smooth current injection characteristic. That is, the concave part 127 may be formed up to a region of a low concentration layer of the first conductive semiconductor layer 121. This is because a high concentration layer of the first conductive semiconductor layer 121 has a high Al concentration and thus has a relatively low current diffusion characteristic. However, the present invention is not limited to this configuration.

Further, the first electrode 131 may be arranged on the first conductive semiconductor layer 121 in the concave part 127. In addition, when currents are injected through the first electrode 131, the light emitting structure 120 may generate light.

The second electrode 132 may be arranged on the light emitting structure 120 and may be electrically connected to the second conductive semiconductor layer 123. More specifically, the second electrode 132 may be arranged on the second conductive semiconductor layer 123. Further, the second electrode 132 is arranged at the inner side of the recess 128 and thus may overlap the active region RA in the first direction. Specifically, the second electrode 132 may be arranged at the inner side of the recess 128 arranged to extend along the concave part 127.

Further, the first electrode 131 and the second electrode 132 may be ohmic electrodes. The first electrode 131 and the second electrode 132 may be formed by including at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, IrOx, RuOx, NiO, RuOx/ITO, Ni/IrOx/Au or Ni/IrOx/Au/ITO, Ag, Ni, Cr, Ti, Al, Rh, Pd, Ir, Sn, In, Ru, Mg, Zn, Pt, Au, and Hf, but are not limited to these materials.

The first insulating layer 140 may be arranged on the light emitting structure 120 to electrically insulate the first electrode 131 from the active layer 122, the second conductive semiconductor layer 123, and the second electrode 132. Further, the first insulating layer 140 may electrically insulate the second electrode 132 from the active layer 122, the first conductive semiconductor layer 121, and the first electrode 131.

In addition, the first insulating layer 140 may be partially arranged on the light emitting structure 120 to partially expose the first conductive semiconductor layer 121 and the second conductive semiconductor layer 123. Accordingly, the first electrode 131 and the second electrode 132 may be arranged in regions exposed in the first insulating layer 140.

Further, the first insulating layer 140 other than the regions in which the first electrode 131 and the second electrode 132 are arranged may prevent external moisture and the like from penetrating into the light emitting structure 120 from the edge during a process of the semiconductor device 10A. Specifically, the first insulating layer 140 may be arranged in the recess 128 to prevent contaminants from penetrating into the recess 128.

Further, the first insulating layer 140 may also be arranged in the concave part 127. Accordingly, the first insulating layer 140 may be located in the recess 128 and the concave part 127 to maintain insulation between the active layer 122 in the active region RA and the active layer 122 in the inactive region RI.

Further, the first insulating layer 140 may be formed by selecting at least one from the group consisting of $SiO_2$, $Si_xO_y$, $Si_3N_4$, $Si_xN_y$, $SiO_xN_y$, $Al_2O_3$, $TiO_2$, AlN, and the like but is not limited thereto. The first insulating layer 140 may be formed as a single layer or multiple layers. For example, the first insulating layer 140 may be a distributed Bragg reflector (DBR) having a multilayer structure including a Si oxide or a Ti compound. However, the present invention is not necessarily limited thereto, and the first insulating layer 140 may include various reflective structures.

Further, when the first insulating layer 140 performs a reflection function, the light emitted from the active layer 122 toward an upper portion or a side surface may be reflected upward to enhance light extraction efficiency.

A connection electrode 135 may be arranged on the first electrode 131 and the first insulating layer 140. Specifically, the connection electrode 135 may extend downward from an upper surface of the first electrode 131 exposed by the first insulating layer 140. For example, the first insulating layer 140 may include a through hole (refer to h1 in FIG. 10E) located to overlap the upper surface of the first electrode 131, and the connection electrode 135 may be arranged in the through hole to be electrically connected to the first electrode 131.

The connection electrode 135 may be formed of a conductive material. For example, the connection electrode 135 may include at least one of Ag, Ni, Cr, Ti, Al, Rh, Pd, Ir, Sn, In, Ru, Mg, Zn, Pt, Au, and Hf. However, the connection electrode 135 is not limited to these materials.

Further, the connection electrode 135 may be arranged under the first insulating layer 140 and may electrically connect a plurality of first electrodes 131 arranged to be spaced apart from each other.

The second insulating layer 141 may be arranged on the first insulating layer 140 and the connection electrode 135. Further, since the second insulating layer 141 is arranged to expose a part of a lower surface of the connection electrode 135, the connection electrode 135 may be electrically connected to the first pad 151 which will be described later through an exposed region.

In addition, the second insulating layer 141 may be arranged so that an upper surface of the second electrode 132 is partially exposed. Accordingly, the second pad 152 may be electrically connected to the second electrode 132 through an exposed region.

Further, the second insulating layer 141 may be formed of a transparent and insulating material. For example, the second insulating layer 141 may include at least one of $SiO_2$, $SiO_x$, $SiO_xN_y$, $Si_3N_4$, $Al_2O_3$, and $TiO_2$ but is not limited thereto.

Further, the second insulating layer 141 and the first insulating layer 140 may be formed of the same material or different materials. In addition, since the second pad 152 and the second insulating layer 141 are arranged on the first insulating layer 140, defects formed in the first insulating layer 140 are difficult to propagate to the second insulating layer 141, and thus in the second insulating layer 141, an interface between the first insulating layer 140 and the second insulating layer 141 may serve to block propagation of the defects.

In addition, the first insulating layer 140 and the second insulating layer 141 may be melted by heat during a process so as to form a single layer, or the interface may not be present between the first insulating layer 140 and the second insulating layer 141 in at least some regions. Accordingly, even when the interface is observed using transmission electron microscopy (TEM) or the like, the interface between the first insulating layer 140 and the second insulating layer 141 may be seen as one layer in at least some regions. Further, the first insulating layer 140 and the second insulating layer 141 may be formed by a single process.

It is possible to improve a problem in which costs of the semiconductor device increase due to degradation of the optical and electrical reliability of the semiconductor device or an increase in process time of the semiconductor device.

Further, the first pad 151 may be arranged on the connection electrode 135 to be electrically connected to the connection electrode 135 and the first electrode 131. Specifically, the first pad 151 may be arranged to cover an upper surface of the connection electrode 135 and a part of the second insulating layer 141. Accordingly, the first pad 151 may vertically overlap the concave part 127 and the second conductive semiconductor layer 123 and the recesses 128 in the inactive region RI. Accordingly, current injection into the first electrode 131 through the first pad 151 may be facilitated. Further, since a path between the first electrodes 131 is reduced due to a position of the first pad 151, a dispersion effect of currents injected into the first pad 151 and the first electrode 131 may be improved. In addition, a semiconductor device of which reliability is enhanced due to improved heat dissipation may be manufactured.

In addition, the first pad 151 may be formed of a conductive material. For example, the first pad 151 may include at least one of Ag, Ni, Cr, Ti, Al, Rh, Pd, Ir, Sn, In, Ru, Mg, Zn, Pt, Au, and Hf. However, the first pad 151 is not limited to these materials. Further, the second pad 152 may be arranged on the second electrode 132 and the second insulating layer 141 to be electrically connected to the second electrode 132. In addition, a lower surface of the first pad 151 and a lower surface of the second pad 152 may be arranged at the same position from the uppermost surface of the semiconductor device 10A. However, the first pad 151 and the second pad 152 are not limited to this configuration. That is, a thickness of the first pad 151 and a thickness of the second pad 152 may be adjusted. For example, occurrence of voids may be reduced by minimizing a height difference between the upper surface of the first pad 151 and the upper surface of the second pad 152 when the first pad 151 and the second pad 152 are bonded.

Further, the second pad 152 may be formed of a conductive material like the first pad 151. For example, the second pad 152 may include at least one of Ag, Ni, Cr, Ti, Al, Rh, Pd, Ir, Sn, In, Ru, Mg, Zn, Pt, Au, and Hf. However, the second pad 152 is not limited to these materials.

The first pad 151 and the second pad 152 may be arranged to be spaced apart from each other. Further, a filling layer 160 may be arranged between the first pad 151 and the second pad 152 or at an outer side of each of the first pad 151 and the second pad 152.

In addition, the second pad 152 may vertically overlap the concave part 127 and the second conductive semiconductor layer 123 and the recess 128 in the inactive region RI. Accordingly, current injection into the second electrode 132 through the second pad 152 may be facilitated. Further, since a path between the second electrodes 132 is reduced due to a position of the second pad 152, a dispersion effect of currents injected into the second pad 152 and the second electrode 132 may be improved.

The filling layer 160 may be formed of an insulating material and may include, for example, resin or the like. Accordingly, the filling layer 160 may protect the first pad 151 and the second pad 152 and improve a supporting force. However, the filling layer 160 may not be present depending on a method of using the semiconductor device.

Referring to FIG. 4, as described above, the recess 128 may include a first recess portion 128a overlapping the first pad 151. Further, the first recess portion 128a may be arranged to extend adjacent to an edge of the concave part. The first recess portion 128a may be arranged to surround the concave part on a plane (a ZY plane). Accordingly, the first recess portion 128a may extend to protect a region into which currents are injected through the second electrode 132 in the concave part from oxidation.

Further, the first recess portion 128a may be arranged adjacent along some of a plurality of concave parts and may be arranged to surround the concave parts. That is, a plurality of first recess portions 128a may be formed in a circular shape along the circular concave parts, and contaminants may be easily prevented from penetrating into the second electrode 132 and the concave part during a process.

Referring to FIG. 5, like the above, the recess 128 may include a second recess portion 128b overlapping the second pad 152. Further, the second recess portion 128b may be arranged to extend adjacent to an edge of the concave part. The second recess portion 128b may be arranged to surround the concave part on a plane (the ZY plane). Accordingly, the second recess portion 128b may extend to protect a region, into which currents are injected through the second electrode 132 in the concave part, from oxidation.

Further, the second recess portion 128b may be arranged adjacent along some of a plurality of concave parts and may be arranged to surround the concave parts. That is, a plurality of second recess portions 128b may be formed in a circular shape along the circular concave parts, and contaminants may be easily prevented from penetrating into the second electrode 132 and the concave part during a process.

Further, a third recess portion 128c may be arranged to extend adjacent to an edge of the light emitting structure 120. That is, the third recess portion 128c may be arranged between the first recess portion 128a and the second recess portion 128b and the edge of the light emitting structure 120. In this case, a maximum width between the third recess portion 128c and the edge of the light emitting structure 120 may be 5 μm to 10 μm. Further, a ratio between the maximum width between the third recess portion 128c and the edge of the light emitting structure 120 and a width of the light emitting structure 120 in one direction may be 1:100 to 1:200. However, this length may be changed according to a size of the light emitting structure of the semiconductor device.

Further, the third recess portion 128c may be arranged between the first pad 151 and the second pad 152 and the edge of the light emitting structure 120. Accordingly, even when peeling, cracking, and the like occur due to heat generated by light emission of the semiconductor device 10A, external high temperature and high humidity, a difference in coefficient of thermal expansion between the light emitting structures 120, and the like, the third recess portion 128c may prevent oxidization of the light emitting structure 120 by moisture, contaminants, or the like which penetrate from the edge which is an outer side of the semiconductor device 10A.

Further, the third recess portion 128c may be arranged to surround the first recess portion 128a and the second recess portion 128b, and the first recess portion 128a, the second recess portion 128b, and the third recess portion 18c may be arranged to be spaced apart from each other. In addition, the first recess portion 128a and the second recess portion 128b may be arranged at an inner side of the third recess portion 128c, and the first recess portion 128a, the second recess portion 128b, and the third recess portion 128c may be arranged to be spaced apart from each other. Accordingly, the recess 128 may easily block not only the moisture which penetrates from an outer side, but also the contaminants injected by the peeling and cracks generated from an inner side by a process or the like.

Further, the semiconductor device according to the embodiment may further include a first bump electrically connected to the first pad 151, a second bump electrically connected to the second pad 152, a first metal pad electrically connected to the first bump, a second metal pad electrically connected to the second bump, and a mounting substrate which supports the first metal pad and the second metal pad. However, these components may not be present. Further, the components may be applied to semiconductor devices according to various embodiments which will be described later.

FIG. 5 is a plan view of a semiconductor device according to another embodiment, FIG. 6 is a cross-sectional view taken along line DD' in FIG. 5, FIG. 7 is a cross-sectional view taken along line EE' in FIG. 5, and FIG. 8 is an enlarged view of portion K in FIG. 6.

Referring to FIG. 5, a semiconductor device 10B according to another embodiment includes a substrate 110, a light emitting structure 120 including a first conductive semiconductor layer 121, a second conductive semiconductor layer 123, and an active layer 122 and arranged on the substrate 110, a first insulating layer 140 partially arranged on the light emitting structure 120, a first electrode 131 electrically connected to the first conductive semiconductor layer 121, a second electrode 132 electrically connected to the second conductive semiconductor layer 123, a first pad 151 arranged on the first electrode 131, a second pad 152 arranged on the second electrode 132, and a second insulating layer 141 which partially covers the first insulating layer 140, the first pad 151, and the second pad 152.

First, the content described in FIG. 1 may be identically applied to the substrate 110, and the first conductive semiconductor layer 121, the active layer 122, and the second conductive semiconductor layer 123 of the light emitting structure 120.

In addition, the light emitting structure 120 may include a concave part 127 and a recess 128.

First, the concave part 127 may be arranged on the second conductive semiconductor layer 123 to be concave toward the first conductive semiconductor layer 121. That is, the concave part 127 is arranged to penetrate the second conductive semiconductor layer 123 and the active layer 126 and penetrate to a partial region of the first conductive semiconductor layer 121, and thus the first conductive semiconductor layer 121 may be exposed.

The concave part 127 may be arranged in the light emitting structure 120 and may be arranged to be further inward with relation to the light emitting structure 120 than the recess 128. For example, the recess 128 may be surrounded by the concave part 127.

Further, the concave part 127 may be arranged at an inner side of an inactive region RI which will be described later. That is, the concave part 127 may overlap the inactive region RI in the second direction.

Further, the concave part 127 may have a circular shape but is not limited to this shape. In addition, the recess 128 is also arranged to extend adjacent to an edge of the concave part 127 and thus may have various shapes like the concave part 127.

The concave part 127 may include a second surface 127b located at a bottom portion, a first surface 127a arranged at one side of the second surface 127b, and a third surface 127c arranged at the other side of the second surface 127b. The first surface 127a may be a portion extending to the first conductive semiconductor layer 121 exposed along a second upper surface 123b of the second conductive semiconductor layer 123. Accordingly, the first surface 127a may include side surfaces of the first conductive semiconductor layer 121, the active layer 122, and the second conductive semiconductor layer 123. Further, the first surface 127a may be arranged to be inclined with respect to the second upper surface 123b at a predetermined angle. In addition, the second surface 127b may be a bottom surface extending from the first surface 127a and to which the first conductive semiconductor layer 121 is exposed. The first electrode 131 which will be described later may be arranged on the second surface 127b. Further, the third surface 127c may be a portion extending from the second surface 127b to the second upper surface 123b adjacent thereto. The third surface 127c may be a surface connected to the first surface 127a.

The recess 128 may be arranged to penetrate the second conductive semiconductor layer 123 and the active layer 122 and penetrate to a partial region of the first conductive semiconductor layer 121. Accordingly, the partial region of the first conductive semiconductor layer 121 may be exposed by the recess 128.

Further, the recess 128 may be arranged to extend adjacent to an edge of the light emitting structure 120. Specifically, the recess 128 may be arranged to extend adjacent to an edge of the active layer 122 or the second conductive semiconductor layer 123. Further, the recesses 128 may be continuously arranged. For example, when the recesses 128 are continuously arranged, the recesses 128 on a plane (a ZY plane) may have a closed-loop shape in the light emitting structure 120. Hereinafter, the recesses 128 will be described based on a case of the closed-loop shape.

Accordingly, the recesses 128 may separate the second conductive semiconductor layer 123 and the active layer 122 into an active region RA and the inactive region RI (In the drawing, the active region and the inactive region are shown based on the second conductive semiconductor layer, but the active region and the inactive region are set within ranges described in the specification). Here, the active regions RA may be located at inner sides of the recesses 128 at the second conductive semiconductor layer 123 and the active layer 122. Further, the upper surface of the second conductive semiconductor layer 123 may be partitioned into a first upper surface 123a and the second upper surface 123b by the recess 128. The first upper surface 123a and the second upper surface 123b may be spaced apart and electrically separated by the recess 128.

Further, the inactive regions RI may be located in regions other than the recess 128 in the second conductive semiconductor layer 123 and the active layer 122. Specifically, the inactive region RI may be located at an outer side of the recess 128 at the second conductive semiconductor layer 123 and the active layer 122. Further, the inactive region RI may be arranged between the concave part 127 and the recess 128.

In addition, the active layer 122 in the active region RA and the active layer 122 in the inactive region RI may be arranged to be spaced apart from each other. The active layer 122 in the active region RA may be arranged to overlap the second electrode 132 in the first direction. Further, in the active region RA, the active layer 122 may be a light emitting region in which electron and hole combination occurs. On the other hand, the active layer 122 in the inactive region RI may be arranged to be spaced apart from the active layer 122 in the active region RA and overlap the first electrode 131 in the first direction. Further, the active layer 122 in the inactive region RI may be a non-light emitting region in which the electron and hole combination does not occur.

By this configuration, even when peeling, cracking, and the like occur in the second insulating layer 141 surrounding the side surfaces and the upper surface of the light emitting structure 120 due to heat generated by light emission of the semiconductor device, external high temperature and high humidity, a difference in coefficient of thermal expansion between the light emitting structures 120, and the like, oxidization of the active layer 122 in the active region RA by external moisture, contaminants, or the like which penetrate into the light emitting structure 120 from the outside may be prevented.

Specifically, in the semiconductor device according to one embodiment, the recesses 128 may block direct connection between the active layer 122 in the active region RA and the active layer 122 in the inactive region RI. Accordingly, when the active layer 122 in the inactive region RI adjacent to a sidewall of the light emitting structure 120 is exposed to the outside due to the aforementioned peeling, the active layer 122 in the inactive region RI may be oxidized due to exposure.

However, since the active layers 122 are arranged in the active region RA and the inactive region RI to be spaced apart from each other by the recesses 128, even when the active layer 122 of in inactive region RI is oxidized, the active layer 122 in the active region RA may be protected from the oxidation. That is, the recess 128 may protect the oxidation of the active layer 122 in the light-emitting region from external moisture.

Specifically, when the semiconductor device generates ultraviolet light, since the energy band gap and Al concentration of the active layer 122 increase compared to a case in which visible light is generated, it may be more susceptible to oxidation. Accordingly, the semiconductor device described in the specification may significantly improve reliability when generating the ultraviolet light.

Further, when the light emitting structure 120 generates the ultraviolet light, since the light emitting structure 120 has high band gap energy, a current dispersion characteristic of the light emitting structure 120 may be degraded and an effective light emitting region may be reduced.

For example, when the light emitting structure 120 is composed of a GaN-based compound semiconductor, in order to emit the ultraviolet light, the light emitting structure may be composed of $Al_xGa_{(1-x)}N$ ($0 \leq x \leq 1$) including a large amount of Al. Here, as an x value which refers to an Al content increases, a resistance of the light emitting structure 120 may increase, and current dispersion and current injection characteristics of the light emitting structure 120 may be degraded.

Accordingly, current spreading in the light emitting structure 120 may be performed in the active region RA. Accordingly, even when the semiconductor device 10B described in the specification has the recess 128, it is possible to maintain optical output. In addition, as described above, the region in which the recess 128 is oxidized due to moisture or the like is limited to an outer region of the recess 128 (for example, the active region RA) to protect the active layer 122 located on an effective light-emitting region (for example, the inactive region RI) from oxidization so that the optical output may be maintained. Here, the effective light-emitting region refers to a region having optical output of a predetermined ratio (for example, 40%) or more of maximum optical output.

Further, the content described in FIGS. 1 to 4 may be identically applied to a description of each recess portion forming the recess 128. That is, the recess 128 may include a first recess portion 128a overlapping the first pad 151, a second recess portion 128b overlapping the second pad 152, and the other concave part 128c.

However, the first recess portion 128a, the second recess portion 128b, and the third recess portion 128c may be arranged to extend adjacent to the edge of the light emitting structure 120. Further, the second recess portion 128b may be arranged adjacent to an outer side of a groove h corresponding to the above-described concave part. In addition, the first recess portion 128a and the second recess portion 128b may be arranged to be spaced apart from each other, and the third recess portion 128c may be arranged between the first recess portion 128a and the second recess portion 128b.

By this configuration, since the first recess portion 128a and the second recess portion 128b vertically overlap the first pad 151 and the second pad 152, respectively, heat dissipation characteristics may be improved and penetration of contaminants into the light emitting structure 120 from the outside may be easily prevented.

Further, the third recess portion 128c may be connected to the first recess portion 128a and the second recess portion 128b, and the first recess portion 128a, the second recess portion 128b, and the third recess portion 128c may be integrally connected.

In addition, the first pad 151 and the second pad 152 may overlap portions of the recess 128 (the first recess portion and the second recess portion) in the first direction, respectively. Accordingly, the first pad 151 and the second pad 152 may easily protect the active layer 122 in the active region RA from external moisture or the like during peeling. Further, since the second pad 152 is arranged to extend to an outer side of the recess, and thus heat dissipation through the second pad is easy, a peeling phenomenon due to heat may be easily prevented.

In addition, the first pad 151 may be arranged on the concave part 127 to extend to the active region RA along the inactive region RI and the recess 128. Accordingly, current injection into the first electrode 131 through the first pad 151 may be facilitated. Further, since a path between the first electrodes 131 is reduced due to a position of the first pad 151, a dispersion effect of currents injected into the first pad 151 and the first electrode 131 may be improved. In addition, a semiconductor device of which reliability is enhanced due to improved heat dissipation may be manufactured. Also, the content of the second pad 152 described above in FIGS. 1 to 4 may be identically applied.

The first electrode 131 may be arranged on the first conductive semiconductor layer 121 exposed by mesa etching to be electrically connected to the first conductive semiconductor layer 121. Further, the first electrode 131 may be arranged on a low concentration layer of the active layer 122 to secure a relatively smooth current injection characteristic. That is, the first electrode 131 may be arranged adjacent to a region of a low concentration layer of the first conductive semiconductor layer 121. This is because a high concentration layer of the first conductive semiconductor layer 121 has a high Al concentration and thus has a relatively low current diffusion characteristic. However, the present invention is not limited to this configuration.

Further, since the first electrode 131 is arranged on the first conductive semiconductor layer 121 at the outer side of the recess 128, the first electrode 131 may overlap the inactive region RI in the second direction. In addition, when currents are injected through the first electrode 131, the light emitting structure 120 may generate light.

The second electrode 132 may be arranged on the second conductive semiconductor layer 123 and may be electrically connected to the second conductive semiconductor layer 123. Further, the second electrode 132 is arranged at the inner side of the recess 128 and thus may overlap the active region RA in the first direction.

The first electrode 131 and the second electrode 132 may be ohmic electrodes. The first electrode 131 and the second electrode 132 may be formed by including at least one of indium tin oxide (ITO), indium zinc oxide (IZO), indium zinc tin oxide (IZTO), indium aluminum zinc oxide (IAZO), and indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, IrOx, RuOx, NiO, RuOx/ITO, Ni/IrOx/Au or Ni/IrOx/Au/ITO, Ag, Ni, Cr, Ti, Al, Rh, Pd, Ir, Sn, In, Ru, Mg, Zn, Pt, Au, and Hf, but are not limited to these materials.

The first insulating layer 140 may be arranged on the light emitting structure 120 to electrically insulate the first electrode 131 from the active layer 122, the second conductive semiconductor layer 123, and the second electrode 132. Further, the first insulating layer 140 may electrically insulate the second electrode 132 from the active layer 122, the first conductive semiconductor layer 121, and the first electrode 131.

In addition, the first insulating layer 140 may be partially arranged on the light emitting structure 120 to partially expose the first conductive semiconductor layer 121 and the second conductive semiconductor layer 123. Accordingly, the first electrode 131 and the second electrode 132 may be arranged in regions exposed in the first insulating layer 140.

Further, the first insulating layer 140 other than the region in which the first electrode 131 and the second electrode 132 are arranged may prevent external moisture and the like from penetrating into the light emitting structure 120 from the edge during a process of the semiconductor device 10B. Specifically, the first insulating layer 140 may be arranged in the recess 128 to prevent contaminants from penetrating into the recess 128.

Further, the first insulating layer 140 may be located in the recess 128 to maintain insulation between the active layer 122 in the active region RA and the active layer 122 in the inactive region RI.

Further, the first insulating layer 140 may be formed by selecting at least one from the group consisting of $SiO_2$, $Si_xO_y$, $Si_3N_4$, $Si_xN_y$, $SiO_xN_y$, $Al_2O_3$, $TiO_2$, AlN, and the like but is not limited thereto. The first insulating layer 140 may be formed as a single layer or multiple layers. For example, the first insulating layer 140 may be a distributed Bragg reflector (DBR) having a multilayer structure including a Si oxide or a Ti compound. However, the present invention is not necessarily limited thereto, and the first insulating layer 140 may include various reflective structures.

Further, when the first insulating layer 140 performs a reflection function, the light emitted from the active layer 122 to an upper portion or a side surface may be reflected upward to enhance light extraction efficiency.

Further, the first pad 151 may be arranged on the first electrode 131. Specifically, the first pad 151 may be arranged to cover an upper surface of the first electrode 131 and a part of the first insulating layer 140.

Further, the first pad 151 may be formed of a conductive material. For example, the first pad 151 may include at least one of Ag, Ni, Cr, Ti, Al, Rh, Pd, Ir, Sn, In, Ru, Mg, Zn, Pt, Au, and Hf. However, the first pad 151 is not limited to these materials.

Further, the second pad 152 may be arranged on the second electrode 132. In addition, an upper surface of the first pad 151 and an upper surface of the second pad 152 may be arranged at the same position from a lower surface of the semiconductor device 10B. However, the first pad 151 and the second pad 152 are not limited to this configuration. That is, a thickness of the first pad 151 and a thickness of the second pad 152 may be adjusted. For example, occurrence of voids may be reduced by adjusting the thicknesses when the first pad 151 and the second pad 152 are bonded.

Further, the second pad 152 may be partially arranged on the first insulating layer 140. In addition, the second pad 152 may be formed of a conductive material like the first pad 151. For example, the second pad 152 may include at least one of Ag, Ni, Cr, Ti, Al, Rh, Pd, Ir, Sn, In, Ru, Mg, Zn, Pt, Au, and Hf. However, the second pad 152 is not limited to these materials.

The second insulating layer 141 may be arranged on the light emitting structure 120, the first insulating layer 140, the first pad 151, and the second pad 152. Accordingly, the second insulating layer 141 may protect the semiconductor device 10B from the outside. Referring to FIGS. 6 and 7, specifically, the second insulating layer 141 may be arranged to partially expose the first pad 151. Accordingly, the second insulating layer 141 may be partially arranged on the first pad 151 so that the first pad 151 may be partially exposed. Accordingly, the exposed first pad 151 may be electrically connected to the outside.

Further, the second insulating layer 141 may be partially arranged on the second pad 152 so that the second pad 152 may be partially exposed. For example, the second insulating layer 141 may include second and third through holes (see FIG. 10I). The second pad 152 may be arranged on the second and third through holes to expose a part of an upper surface of the second electrode 132. Further, the exposed second electrode 132 may be electrically connected to the second pad 152 and may be electrically connected to the outside through the second pad 152.

In addition, a part of the second insulating layer 141 may overlap the recess 128 in the first direction. Accordingly, since the recess 128 is protected by the first insulating layer 140, the second pad 152, and the second insulating layer 141, the semiconductor device according to the embodiment may be prevented from optical output degradation due to peeling and oxidation by moisture.

Further, the second insulating layer 141 may be formed of a transparent and insulating material. For example, the second insulating layer 141 may include at least one of $SiO_2$, $SiO_x$, $SiO_xN_y$, $Si_3N_4$, $Al_2O_3$, and $TiO_2$ but is not limited thereto.

Further, the second insulating layer 141 and the first insulating layer 140 may be formed of the same material or different materials. In addition, since the second pad 152 and the second insulating layer 141 are arranged on the first insulating layer 140, defects formed in the first insulating layer 140 are difficult to propagate to the second insulating layer 141, and thus in the second insulating layer 141, an interface between the first insulating layer 140 and the second insulating layer 141 may block propagation of the defects.

In addition, as described above, the first insulating layer 140 and the second insulating layer 141 may be melted by heat during the process to be formed as a single layer, or an interface between the first insulating layer 140 and the second insulating layer 141 may not be present in at least some regions. Accordingly, even when the interface is observed using transmission electron microscopy (TEM) or the like, the interface between the first insulating layer 140 and the second insulating layer 141 may be seen as one layer in at least some regions. Further, the first insulating layer 140 and the second insulating layer 141 may be formed by a single process. It is possible to improve a problem in which costs of the semiconductor device increase due to degradation of the optical and electrical reliability of the semiconductor device or an increase in process time of the semiconductor device.

Referring to FIG. 8, the first electrode 131 may be electrically connected to the first conductive semiconductor layer 121. The first electrode 131 may include a first groove 131a formed on one surface thereof. Unlike a general visible light emitting device, in the case of an ultraviolet light emitting device, the electrode needs to be heat treated at a high temperature for ohmic properties. For example, the first electrode 131 and/or the second electrode 132 may be heat treated at about 600° C. to 900° C., and in this process, an oxide film OX1 may be formed on the surface of the first electrode 131. Since the oxide film OX1 may function as a resistive layer, an operating voltage may increase.

The oxide film OX1 may be formed by oxidizing a material constituting the first electrode 131. Accordingly, in a process of heat treatment of the first electrode 131, when ingredients such as concentration and/or mass percentage of the material constituting the first electrode 131 are not constant, or ununiform heat is applied to the surface of the first electrode 131 due to other elements, a thickness of the oxide film OX1 may be ununiformly formed.

Accordingly, the first electrode 131 according to the embodiment may remove the oxide film OX1 by forming the first groove 131a on one surface thereof. In this process, a protrusion 131b surrounding the first groove 131a may be formed.

During the process of the heat treatment of the first electrode 131, oxidation and/or corrosion may occur in at least some regions of the side surface of the first conductive semiconductor layer 121, the side surface of the active layer 122, and the side surfaces of the second conductive semiconductor layer 123 which are exposed between the first electrode 131 and the second electrode 132.

However, according to the embodiment, the first insulating layer 140 may extend from a partial region of the upper surface of the second conductive semiconductor layer 123 and may be arranged up to side surfaces of the active layer 122 and a partial region of the first conductive semiconductor layer 121. Further, the first insulating layer 140 may be arranged on the side surface of the first conductive semiconductor layer 121, the side surface of the active layer 122, and the side surface of the second conductive semiconductor layer 123 between the first electrode 131 and the second electrode 132.

Accordingly, when the first electrode 131 is heat-treated, corrosion of at least some regions of the side surfaces of the first conductive semiconductor layer 121, the side surfaces of the active layer 122, and the side surfaces of the second conductive semiconductor layer 123 may be prevented by the first insulating layer 140. Further, the first insulating layer 140 may easily prevent oxidation or the like from occurring in each region of the light emitting structure 120 exposed by the recess 128.

In addition, when the first electrode 131 is entirely etched, there is a problem in that the first insulating layer 140 arranged adjacent thereto may also be etched. Accordingly, in the embodiment, by performing etching on only a partial region of the first electrode 131, an edge region may remain to form the protrusion 131b. An upper surface width d3 of the protrusion 131b may be 1 μm to 10 μm. When the width d3 is 1 μm or more, it is possible to prevent etching of the first insulating layer 140, and when the width d3 is 10 μm or less, since an area of the first groove increases to increase the region from which the oxide film is removed, a surface area which becomes resistance may be reduced.

For example, when the first groove 131a is formed in the partial region of the first electrode 131, a photoresist may be arranged and a mask composed of the photoresist may be arranged through an exposure process. In the mask, each of side surfaces between an upper surface and a lower surface may have an inclination angle with respect to a bottom surface of the substrate. Accordingly, since a partial region of the protrusion 131b of the first electrode 131 may be etched by adjusting the inclination angle of the mask, a thickness of the oxide film OX1 formed on the protrusion 131b may be ununiformly arranged. In some cases, the protrusion 131b of the first electrode 131 and the oxide film remaining on the side surface may be partially removed.

The connection electrode 135 may be arranged on the first electrode 131. In this case, the connection electrode 135 may include a first uneven portion 135a arranged in the first groove 131a. Accordingly, since electrical connection between the connection electrode 135 and the first electrode 131 is improved, an operating voltage may be lowered. When the first groove 131a is not present in the first electrode 131, since the oxide film is not removed, a resistance between the connection electrode 135 and the first electrode 131 may increase.

The connection electrode 135 may cover a side surface of the first electrode 131. Accordingly, since a contact area between the connection electrode 135 and the first electrode 131 increases, the operating voltage may be further lowered. Further, since the connection electrode 135 covers the side surface of the first electrode 131, it is possible to protect the first electrode 131 from moisture or other contaminants which penetrate from the outside. Accordingly, the reliability of the semiconductor device may be improved.

The connection electrode 135 may include a second uneven portion 135b arranged in a separation region d2 between the first insulating layer 140 and the first electrode 131. The second uneven portion 135b may come into direct contact with the first conductive semiconductor layer 121. Accordingly, it is possible to have an effect of more evenly dispersing currents injected into the first conductive semiconductor layer 121. In this case, when the connection electrode 135 is in direct contact with the first conductive semiconductor layer 121, a resistance between the connection electrode 135 and the first conductive semiconductor layer 121 may be greater than a resistance between the first electrode 131 and the first conductive semiconductor layer 121. A width of the separation area d2 may be roughly 1 μm to 10 μm.

The connection electrode 135 may have a first region d1 extending to an upper portion of the first insulating layer 140. Accordingly, since a total area of the connection electrode 135 increases, the operating voltage may be lowered.

When the connection electrode 135 does not extend to the upper portion of the first insulating layer 140, an end of the first insulating layer 140 may be lifted and separated from the first conductive semiconductor layer 121. Accordingly, external moisture and/or other contaminants may be introduced into a gap. Accordingly, at least some regions of the side surfaces of the first conductive semiconductor layer 121, the side surfaces of the active layer 122, and the side surfaces of the second conductive semiconductor layer 123 may be corroded or oxidized.

In this case, a ratio (d4:d1) of a total area of a fourth region d4 and a total area of the first region d1 may be 1:0.15 to 1:1. The total area of the first region d1 may be smaller than the total area of the fourth region d4. Here, the fourth region d4 may be a region in which the first insulating layer 140 is arranged on the first conductive semiconductor layer 121 in a region between the first and second electrodes 131 and 132.

When the ratio (d4:d1) of the total area is 1:0.15 or more, the area of the first region d1 may increase and cover the upper portion of the first insulating layer 140 to prevent lifting. Further, since the first insulating layer 140 is arranged between the first electrode 131 and the second electrode 132, penetration of external moisture or contaminants may be prevented.

In addition, when the ratio (d1:d4) of the total area is 1:1 or less, an area of the first insulating layer 140 capable of sufficiently covering the region between the first electrode 131 and the second electrode 132 may be secured. Accordingly, it is possible to prevent corrosion of the light emitting structure during heat treatment of the first electrode 131 and/or the second electrode 132.

According to the embodiment, since the second insulating layer 141 is arranged on the first insulating layer 140 in the region between the first electrode 131 and the second electrode 132, even when a defect occurs in the first insulating layer 140, penetration of external moisture and/or other contaminants may be prevented.

FIG. 9 is a conceptual diagram of a semiconductor device package according to the embodiment.

A semiconductor device package 200 according to the embodiment may include a body 205, a first electrode layer 211 and a second electrode layer 212 installed in the body 205, a semiconductor device 10 installed in the body 205 and electrically connected to the first electrode layer 211 and the second electrode layer 212, and a molding member 220 including a phosphor (not shown) to surround the semiconductor device 10

The first electrode layer 211 and the second electrode layer 212 are electrically separated from each other and serve to provide power to the semiconductor device 10. Further, the first electrode layer 211 and the second electrode layer 212 may serve to increase light efficiency by reflecting light generated from the semiconductor device 10 and may also serve to dissipate heat generated from the semiconductor device 10 to the outside.

The semiconductor device 10 exemplifies the semiconductor device according to one embodiment but is not limited thereto, and semiconductor devices according to other embodiments may also be applied.

A light emitting device according to the embodiment may be applied to a backlight unit, a lighting unit, a display device, an indicating device, a lamp, a street light, a lighting device for a vehicle, a display device for a vehicle, a smart watch, and the like but is not limited thereto.

FIGS. 10A to 10J are views illustrating a method of manufacturing the semiconductor device according to one embodiment.

Referring to FIG. 10A, a substrate 110, and a light emitting structure 120 on the substrate 110 may be arranged. The substrate 110 may include a transparent material. For example, the substrate 110 may include any one of sapphire ($Al_2O_3$), SiC, Si, GaN, ZnO, GaP, InP, Ge, and $Ga_2O_3$. However, the substrate 110 is not limited to these materials.

The light emitting structure 120 may include a first conductive semiconductor layer 121 arranged on the substrate 110, an active layer 122 arranged on the first conductive semiconductor layer 121, and a second conductive semiconductor layer 123 arranged on the active layer 122. That is, the first conductive semiconductor layer 121, the active layer 122, and the second conductive semiconductor layer 123 may be sequentially stacked on the substrate 110.

The light emitting structure 120 may be formed by methods such as a metal organic chemical vapor deposition (MOCVD) method, a chemical vapor deposition (CVD) method, a plasma-enhanced chemical vapor deposition (PECVD) method, a molecular beam growth (Molecular Beam Epitaxy; MBE) method, a hydride vapor phase epitaxy (HVPE) method, a sputtering method, and the like.

Referring to FIG. 10B, a recess 128 and a concave part 127 may be arranged in the light emitting structure 120. The recess 128 and the concave part 127 may be formed by mesa etching. For example, the recess 128 and the concave part 127 may be formed by wet etching or dry etching but are not limited to this method. The recess 128 and the concave part 127 may be formed by the same process but may be respectively formed according to thicknesses and diameters of the recess 128 and the concave part 127.

Due to this etching, the first conductive semiconductor layer 121 may be exposed. Further, the recess 128 may be formed by extending adjacent to an edge of the light emitting structure 120 and an edge of the concave part 127 after the concave part 127 is formed.

Referring to FIG. 10C, a first electrode 131 may be arranged on the first conductive semiconductor layer 121 exposed by the concave part 127 and thus may be electrically connected to the first conductive semiconductor layer 121. The first electrode 131 may be formed by an E-beam evaporator method, a thermal evaporator method, a metal organic chemical vapor deposition (MOCVD) method, a sputtering method, and a pulsed laser deposition (PLD) method but is not limited thereto.

Further, a second electrode 132 may be arranged on the second conductive semiconductor layer 123 and may be electrically connected to the second conductive semiconductor layer 123. Likewise, the second electrode 132 may also be formed by an E-beam evaporator method, a thermal evaporator method, a metal organic chemical vapor deposition (MOCVD) method, a sputtering method, and a pulsed laser deposition (PLD) method but is not limited thereto.

Further, the first electrode 131 and the second electrode 132 may be formed by the same process but are not limited thereto, and an arrangement order may be variously changed.

Referring to FIG. 10D, a first insulating layer 140 may be arranged on the light emitting structure 120. Further, the first insulating layer 140 may be arranged on the first electrode 131 and the second electrode 132. However, regions where the first electrode 131 and the second electrode 132 are arranged are exposed through etching and then the first electrode 131 and the second electrode 132 may be formed after the first insulating layer 140 is arranged. That is, a forming order may be changed.

Referring to FIG. 10E, in the first insulating layer 140, a first through hole h1 may be formed to expose the first electrode 131. Accordingly, the first electrode 131 may be partially exposed to the outside.

Referring to FIGS. 10F and 10E, a connection electrode 135 may be arranged in the first through hole h1. Further, the connection electrode 135 may be arranged in an entire region even under the first insulating layer 140. In addition, the connection electrode 135 is partially removed, and thus the first insulating layer 140 may be partially exposed. However, since the connection electrode 135 may be removed when a partial region of a second insulating layer 141 is removed as described later in FIG. 10I, a removal order may be changed.

Referring to FIG. 10H, the second insulating layer 141 may be arranged under the connection electrode 135. Accordingly, the second insulating layer 141 may cover the connection electrode 135 and the exposed first insulating layer 140.

Referring to FIG. 10I, a second through hole h2 may be formed in the second insulating layer 141 by etching so that the connection electrode 135 may be partially exposed. Further, a third through hole h3 may be formed in the second insulating layer 141 by etching so that the second electrode 132 may be exposed. However, a connection layer which electrically connects the second electrode and a second pad which will be described later may be arranged on the second electrode 132 like the above-described connection electrode, but the present invention is not limited thereto.

Referring to FIG. 10J, a first pad 151 may be partially arranged on the second insulating layer 141 and may also be arranged even in the above-described second through hole h2. The first pad 151 may be electrically connected to the connection electrode 135 through the second through hole h2 to form an electrical path with the connection electrode 135, the first electrode 131, and the first conductive semiconductor layer 121.

Further, a second pad 152 may be partially arranged on the second insulating layer 141 and the first insulating layer 140. In addition, the second pad 152 may be arranged on the second electrode 132 to be electrically connected to the second electrode 132. Accordingly, the second electrode 132, the second conductive semiconductor layer 123, and the second pad 152 may form an electrical path.

Further, a filling layer 160 may be arranged between the first pad 151 and the second pad 152 or at an outer side of each of the first pad 151 and the second pad 152. However, as described above, the filling layer 160 may not be present. Further, after this process, a dicing process may be performed in order to manufacture a plurality of semiconductor devices.

The semiconductor device may be used as a light source of a lighting system, a light source of an image display device, or a light source of a lighting device. That is, the semiconductor device may be applied to various electronic devices arranged in a case to provide light. For example, when the semiconductor device and an RGB phosphor are mixed and used, white light having an excellent color rendering index (CRI) may be implemented.

The above-described semiconductor device may be configured as a light emitting device package and may be used as a light source of a lighting system, for example, may be used as a light source of an image display device, a light source of a lighting device, or the like.

The semiconductor device may be used as an edge type backlight unit or a direct type backlight unit when used as a backlight unit of an image display device and may be used as a luminaire or bulb type and also used as a light source of a mobile terminal when used as a light source for a lighting device.

The light emitting device includes a laser diode in addition to the above-described light emitting diode.

Like the light emitting device, the laser diode may include a first conductive semiconductor layer, an active layer, and a second conductive semiconductor layer that have the above-described structures. Further, after bonding a p-type first conductive semiconductor and an n-type second conductive semiconductor, an electroluminescence phenomenon in which light is emitted when currents flow is used, but there are differences in phase and directivity of the emitted light. That is, in the laser diode, light having one specific wavelength (a monochromatic beam) may be emitted in the same direction with the same phase using a phenomenon called stimulated emission and a constructive interference phenomenon, and due to these characteristics, the laser diode may be used for optical communication, medical equipment, semiconductor processing equipment, and the like.

A photodetector, which is a kind of transducer which detects light and converts intensity of the light into an electric signal, may be an example of a light receiving device. As this photodetector, a photo cell (silicon or selenium), a photoconductive device (cadmium sulfide or cadmium selenide), a photodiode (for example, a PD having a peak wavelength in a visible blind spectral region or true blind spectral region), a photo transistor, a photomultiplier tube, a phototube (vacuum or gas-filled), an infra-red (IR) detector, or the like is provided, but the embodiment is not limited thereto.

Further, the semiconductor device such as the photodetector may be generally manufactured using a direct bandgap semiconductor having excellent light conversion efficiency. Alternatively, the photodetector has various structures, and the most common structures are a pin-type photodetector using a p-n junction, a Schottky photodetector using a Schottky junction, a metal semiconductor metal (MSM) photodetector, and the like.

Like the light emitting device, the photodiode may include a first conductive semiconductor layer, an active layer, and a second conductive semiconductor layer that have the above-described structures and may be formed as a p-n junction or pin structure. The photodiode operates by applying a reverse bias or zero bias, and when light is incident on the photodiode, since electrons and holes are generated, currents flow. In this case, magnitude of the currents may be substantially proportional to intensity of the light incident on the photodiode.

A photovoltaic cell or solar cell is a kind of the photodiode and may convert light into electric current. The solar cell may include a first conductive semiconductor layer, an active layer, and a second conductive semiconductor layer that have the above-described structures like the light emitting device.

Further, the solar cell may be used as a rectifier of an electronic circuit through a rectification characteristic of a general diode using a p-n junction and may be applied to an ultra-high frequency circuit to be applied to an oscillator circuit or the like.

In addition, the above-described semiconductor device is not necessarily implemented only with a semiconductor and may further include a metallic material in some cases. For example, the semiconductor device such as a light receiving device may be implemented using at least one of Ag, Al, Au, In, Ga, N, Zn, Se, P, and As and may also be implemented using a semiconductor material doped by a p-type or n-type dopant or an intrinsic semiconductor material.

The invention claimed is:

1. A semiconductor device comprising:
    a substrate;
    a light emitting structure including a first conductive semiconductor layer, a second conductive semiconductor layer, and an active layer arranged between the first conductive semiconductor layer and the second conductive semiconductor layer, which are arranged on the substrate, a concave part that is concave on the second conductive semiconductor layer toward the first conductive semiconductor layer, and a recess;
    a first electrode arranged on the concave part and electrically connected to the first conductive semiconductor layer;
    a second electrode arranged on the light emitting structure and electrically connected to the second conductive semiconductor layer;
    a first pad arranged on the first electrode; and
    a second pad arranged on the second electrode,
    wherein both the concave part and the recess penetrate into a partial region of the first conductive semiconductor layer, and the concave part extends into the first conductive semiconductor layer further toward the substrate than the recess,
    wherein the recess separates the second conductive semiconductor layer and the active layer into an active region and an inactive region, and the concave part is disposed between two immediately adjacent inactive regions,
    wherein the first pad overlaps the concave part, the second conductive semiconductor layer in the inactive region, and the recess in a vertical direction.

2. The semiconductor device of claim 1, wherein the second conductive semiconductor layer in the inactive region and the active layer are arranged between the concave part and the recess.

3. The semiconductor device of claim 1, wherein the second pad overlaps the concave part, the second conductive semiconductor layer in the inactive region, and the recess in the vertical direction.

4. The semiconductor device of claim 1, wherein the recess is arranged to extend adjacent to at least one of an edge of the light emitting structure and an edge of the recess.

5. The semiconductor device of claim 1, wherein the recess overlaps at least one of at least a portion of the first pad and at least a portion of the second pad in the vertical direction.

6. The semiconductor device of claim 5, wherein the recess includes a first recess portion overlapping the first pad in the vertical direction, and a second recess portion overlapping the second pad in the vertical direction.

7. The semiconductor device of claim 6, wherein the recess includes a third recess portion other than the first recess portion and the second recess portion.

8. The semiconductor device of claim 7, wherein the first recess portion, the second recess portion, and the third recess portion are connected to each other.

9. The semiconductor device of claim 7, wherein the third recess portion is spaced apart from the first recess portion and the second recess portion.

10. The semiconductor device of claim 7, wherein the first recess portion and the second recess portion are arranged to surround the concave part.

11. The semiconductor device of claim 7, wherein the third recess portion is arranged to surround the first recess portion and the second recess portion.

12. The semiconductor device of claim 1, further comprising a first insulating layer partially arranged on the light emitting structure.

13. The semiconductor device of claim 12, further comprising a second insulating layer configured to cover a part of the first insulating layer, wherein the first pad and the second pad are arranged on the second insulating layer.

14. A method of manufacturing a semiconductor device including:
    disposing a light emitting structure on a substrate, wherein the light emitting structure includes a first conductive semiconductor layer, a second conductive semiconductor layer, and an active layer arranged between the first conductive semiconductor layer and the second conductive semiconductor layer, which are arranged on the substrate, a concave part that is concave on the second conductive semiconductor layer toward the first conductive semiconductor layer, and a recess;
arranging a recess and a concave part in the light emitting structure;
arranging a first electrode on the first conductive semiconductor layer exposed by the concave portion and a second electrode on the second conductive semiconductor layer; and
disposing a first pad on the first electrode and a second pad on the second electrode,
wherein both the concave part and the recess penetrate into a partial region of the first conductive semiconductor layer, and the concave part extends into the first conductive semiconductor layer further toward the substrate than the recess,
wherein the recess separates the second conductive semiconductor layer and the active layer into an active region and an inactive region, and the concave part is disposed between two immediately adjacent inactive regions, and
wherein the first pad overlaps the concave part, the second conductive semiconductor layer in the inactive region, and the recess in a vertical direction.

15. The method of manufacturing the semiconductor device of claim 14, further comprising disposing a first insulating layer on the light emitting structure.

16. The method of manufacturing the semiconductor device of claim 14, wherein the second pad overlaps the concave part, the second conductive semiconductor layer in the inactive region, and the recess in the vertical direction.

17. The method of manufacturing the semiconductor device of claim 14, wherein the recess is arranged to extend adjacent to at least one of an edge of the light emitting structure and an edge of the recess.

\* \* \* \* \*